(12) United States Patent
Yamazaki et al.

(10) Patent No.: US 8,049,669 B2
(45) Date of Patent: Nov. 1, 2011

(54) SEMICONDUCTOR DEVICE COMPRISING CIRCUIT BETWEEN FIRST AND SECOND CONDUCTING WIRES

(75) Inventors: Shunpei Yamazaki, Setagaya (JP); Mai Akiba, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1057 days.

(21) Appl. No.: 10/592,780

(22) PCT Filed: Mar. 24, 2005

(86) PCT No.: PCT/JP2005/006205
§ 371 (c)(1),
(2), (4) Date: Sep. 14, 2006

(87) PCT Pub. No.: WO2005/093900
PCT Pub. Date: Oct. 6, 2005

(65) Prior Publication Data
US 2007/0176845 A1 Aug. 2, 2007

(30) Foreign Application Priority Data
Mar. 26, 2004 (JP) .................................. 2004-090743

(51) Int. Cl.
*H01Q 1/38* (2006.01)
(52) U.S. Cl. .................................. 343/700 MS; 343/895
(58) Field of Classification Search .................. 343/895, 343/702, 700 MS
See application file for complete search history.

(56) References Cited

U.S. PATENT DOCUMENTS

| | | | | |
|---|---|---|---|---|
| 5,345,231 | A | * | 9/1994 | Koo et al. ................. 340/870.31 |
| 5,574,470 | A | * | 11/1996 | de Vall ........................... 343/895 |
| 6,164,551 | A | * | 12/2000 | Altwasser ....................... 235/492 |
| 6,304,232 | B1 | * | 10/2001 | Brown et al. ................... 343/895 |
| 6,353,420 | B1 | * | 3/2002 | Chung ............................ 343/895 |
| 6,421,013 | B1 | * | 7/2002 | Chung ................... 343/700 MS |
| 6,839,963 | B1 | * | 1/2005 | Haghiri-Tehrani et al. ..... 29/852 |
| 6,845,034 | B2 | * | 1/2005 | Bhattacharyya ............... 365/149 |
| 7,088,145 | B2 | * | 8/2006 | Baude et al. ................... 326/121 |
| 7,278,025 | B2 | * | 10/2007 | Saito et al. ..................... 713/185 |

(Continued)

FOREIGN PATENT DOCUMENTS

EP 0 952 543 10/1999
(Continued)

OTHER PUBLICATIONS

International Search Report (Application No. PCT/JP2005/006205) dated May 31, 2005.

(Continued)

*Primary Examiner* — Hoanganh Le
(74) *Attorney, Agent, or Firm* — Eric J. Robinson; Robinson Intellectual Property Law Office, P.C.

(57) ABSTRACT

It is an object of the present invention to provide an ID chip in which gain of an antenna is increased and the mechanical strength of an integrated circuit can be enhanced without suppressing a circuit scale. A semiconductor device typified by an ID chip of the present invention includes an integrated circuit using a semiconductor element formed from a thin semiconductor film and an antenna connected to the integrated circuit. The antenna and the integrated circuit are formed on a substrate, and a conducting wire or a conductive film included in the antenna is divided into two layers and formed so as to sandwich the substrate provided with the integrated circuit.

42 Claims, 20 Drawing Sheets

U.S. PATENT DOCUMENTS

| | | | |
|---|---|---|---|
| 2002/0027531 A1 * | 3/2002 | Brown et al. | 343/895 |
| 2003/0197598 A1 | 10/2003 | Hayashi | |

FOREIGN PATENT DOCUMENTS

| EP | 0977145 A | 2/2000 |
|---|---|---|
| JP | 62-150177 | 9/1987 |
| JP | 09-153123 | 6/1997 |
| JP | 10-166770 | 6/1998 |
| JP | 11-135675 A | 5/1999 |
| JP | 2000-020665 | 1/2000 |
| JP | 2000-311226 A | 11/2000 |
| JP | 2002-049899 | 2/2002 |
| JP | 2002-271127 | 9/2002 |
| JP | 2003-296683 A | 10/2003 |

OTHER PUBLICATIONS

Written Opinion (Application No. PCT/JP2005/006205) dated May 31, 2005.

Korean Office Action (Application No. 2006-7022080) Dated Jun. 1, 2011.

* cited by examiner

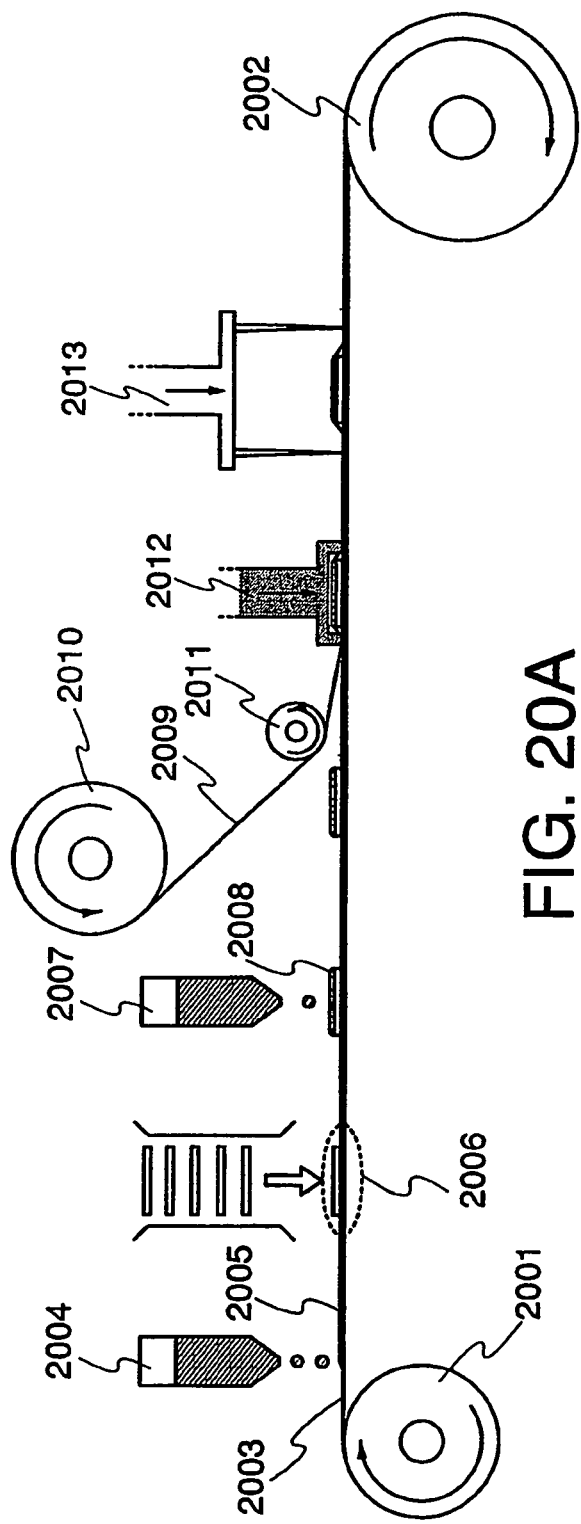

SEMICONDUCTOR DEVICE COMPRISING CIRCUIT BETWEEN FIRST AND SECOND CONDUCTING WIRES

TECHNICAL FIELD

The present invention relates to a semiconductor device that is capable of wireless communication.

BACKGROUND ART

A semiconductor device such as an ID chip that can transmit and receive data such as identifying information wirelessly has been coming into practical use in various areas, and the market of such a semiconductor device as a communication information terminal of a new mode is anticipated to grow further. An ID chip is also called a wireless tag, an RFID (Radio frequency identification) tag or an IC tag, and a type having an antenna and an integrated circuit formed by using a semiconductor substrate is coming into practical use at present.

There are two cases in forming an ID chip, where an integrated circuit and an antenna formed separately are connected later, and where an integrated circuit and an antenna are formed so as to range over one substrate.

As for the ID chip formed by connecting an integrated circuit and an antenna which are first formed separately, defects are easily caused at the connection portion of the integrated circuit and the antenna, and thus it is difficult to increase the process yield. Further, an ID chip is expected to be attached to a flexible material such as paper or plastic depending on its use. Accordingly, a stress is applied, in some cases, to a substrate where an integrated circuit is formed in using an ID chip, even though the integrated circuit is favorably connected to the antenna. Thus, there is a problem that defects are caused easily by the stress, which leads to low reliability.

On the other hand, in an ID chip in which an integrated circuit and an antenna are formed on a substrate, such a defect in a connection portion is not easily caused, different from one in which an integrated circuit and an antenna are formed separately. However, if the number of ID chips obtained from one substrate is to be secured, the area for forming an antenna is limited accordingly. Therefore, it is difficult to form a highly advantageous antenna due to the size limit of an antenna.

A semiconductor substrate used for forming an integrated circuit is generally poor in flexibility and mechanical strength, which is a drawback. However, the mechanical strength can be improved to some extent by reducing the area of the integrated circuit itself. However, the case is not favorable, since securing a circuit scale is difficult and the use of an ID chip is limited. Therefore, it is not favorable that the area of an integrated circuit is reduced when securing the circuit scale of the integrated circuit without careful thought.

The present invention has been made in view of the above described problems. It is an object of the present invention to provide an ID chip in which gain of an antenna is increased and the mechanical strength of an integrated circuit can be enhanced without suppressing a circuit scale. Further, the present invention relates to a packing material, a tag, a certificate, a bank note, securities and the like using the ID chip.

DISCLOSURE OF INVENTION

A semiconductor device typified by an ID chip of the present invention includes an integrated circuit using a semiconductor element formed from a thin semiconductor film and an antenna connected to the integrated circuit. The antenna and the integrated circuit are formed on one substrate, and a conducting wire or a conductive film included in the antenna is divided into two layers and formed so as to sandwich the substrate provided with the integrated circuit. When a conducting wire or a conductive film is formed separately as two layers, spaces above and below the formed substrate can be wholly utilized as an area for the antenna. Accordingly, the limitation on antenna sized can be alleviated; thus, a highly advantageous antenna can be formed. Such an ID chip in which an antenna and an integrated circuit are formed over one substrate according to the invention is also referred to as a wireless chip.

One or more antennas may be formed. For example, when conducting wires or conductive films formed separately as two layers are electrically connected with each other, when the conducting wires or conductive films can be used as one antenna. Further, when the conducting wires or conductive films formed separately as two layers are electrically isolated, the conducting wires or conductive films can be used as two antennas having different functions.

In the case where the conducting wires or conductive films formed separately as two layers are electrically isolated, one of the two antennas can be used for signal transmission/reception and the other can be used for applying power to an integrated circuit. Alternatively, one of the two antennas can be used for signal transmission and the other may be used for signal reception and applying power to an integrated circuit.

Note that an integrated circuit and an antenna may be formed directly over a substrate. Alternatively, an integrated circuit and an antenna may be formed over a substrate, then separated therefrom, and attached to another substrate that is prepared separately. The attachment of an integrated circuit may be carried out according to various kinds of methods as follows: a metal oxide film is formed between a high heat resistant substrate and an integrated circuit, and the metal oxide film is weakened by crystallization to separate the integrated circuit and attach it to an object; a separation layer is provided between a high heat resistant substrate and an integrated circuit, and the separation layer is removed by laser irradiation or by etching to separate the integrated circuit from the substrate and attach it to an object; and a high heat resistant substrate over which an integrated circuit is formed is mechanically removed or is removed by etching using a solution or a gas to separate the integrated circuit from the substrate, thereby attaching it to an object, for example.

Integrated circuits, which are formed separately, may be attached to one another to stack the integrated circuits such that the circuit scale or the memory capacity is increased. Since the integrated circuits are dramatically thin in thickness as compared with an ID chip manufactured using a semiconductor substrate, the mechanical strength of the ID chip can be maintained to some extent even when the plural integrated circuits are stacked. The stacked integrated circuits can be connected to one another by using a known connection method such as a flip chip method, a TAB (tape automated bonding) method, or a wire bonding method.

The category of the present invention includes a packing material, a tag, a certificate, a bank note, a portfolio and the like using the ID chip. Packing materials are equivalent to a support medium, such as a wrap, a plastic bottle, a tray and a capsule, which can be shaped or has been shaped to wrap up an object. Tags according to the present invention correspond to tags such as a luggage tag, a price tag, or a name tag which have information of the objects attached with the tags. Certificates according to the present invention correspond to a document for certificating facts such as a family register, a residency card, a passport, a license, an identification card, a membership card, a credit card, a cash card, a prepaid card, a consultation card, or a commuter ticket. Portfolios according to the present invention correspond to certificates that show property rights in private law such as bills, checks, carriage notes, cargo certificates, warehouse certificates, stock certificates, bond certificates, gift certificates and mortgage securities.

According to the above structure of the invention, the size limit of an antenna can be alleviated, which can enhance gain.

Further, a plurality of antennas having different functions can be formed without reducing the size of the antennas. In particular, when the antennas are separately used according to each function, antennas and integrated circuits can be optimized according to each function. For example, in the case of forming an antenna for signal transmission/reception and another for applying power to an integrated circuit, the latter antenna can be designed to be advantageous for supplying power to an integrated circuit. Accordingly, higher supply voltage can be obtained; thus, the operation margin can be increased. Further, in the case of forming an antenna for signal transmission and another for signal reception and for applying power to an integrated circuit, the former antenna can be designed to be advantageous for signal transmission. Accordingly, load modulation can be applied to the former antenna with a small amount of current; thus, even a TFT with low on-state current can be used as a switch for applying load modulation, and the power to be consumed for signal transmission can be reduced.

Generation of connection failure between an integrated circuit and an antenna can be reduced by forming the integrated circuit and the antenna over one substrate. Further, when a flexible substrate is used, a connection failure due to application of stress to the substrate can be also reduced, which leads to higher reliability.

A flexible substrate can be used since an integrated circuit is formed by using a semiconductor element formed from a thin semiconductor film. The high mechanical strength can be obtained without reducing the area, different from an integrated circuit using a semiconductor substrate. Therefore, the mechanical strength of an integrated circuit can be improved without reducing the circuit scale and to extend the application range of an ID chip.

BRIEF DESCRIPTION OF DRAWINGS

FIGS. 20A to 20C are figures showing a method for covering an ID chip with a cover material by using a roll-to-roll process.

BEST MODE FOR CARRYING OUT THE INVENTION

Embodiment modes and embodiments according to the present invention will be described hereinafter with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as limited to the description of the embodiment modes and embodiments given below.

Figure 1A:
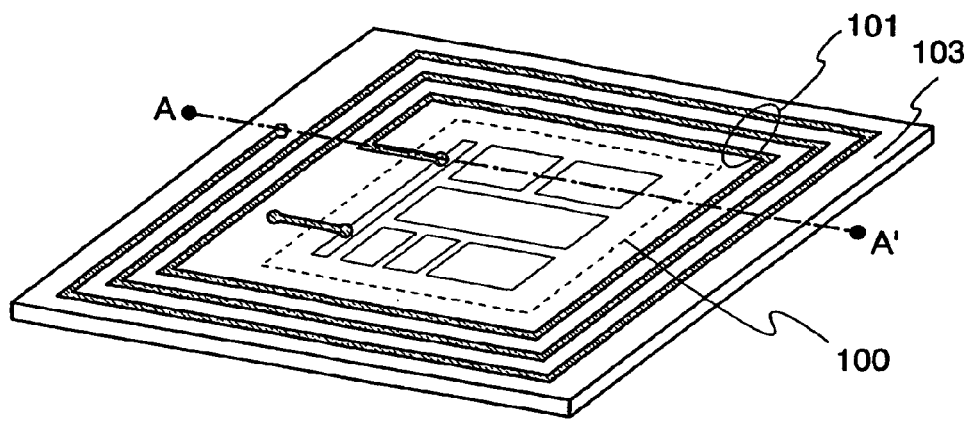
FIGS. 1A to 1C are perspective views and a cross-sectional view of an ID chip of the invention.
Figure 1B:
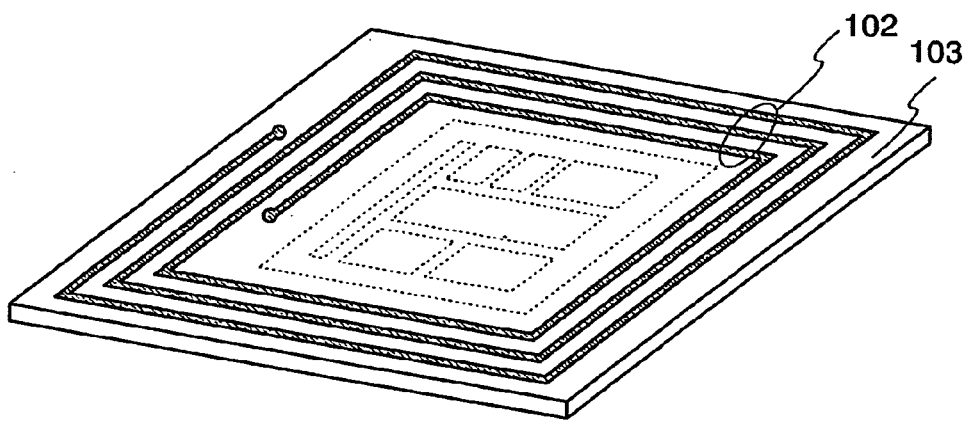

A structure of an ID chip according to the present invention will be described with reference to FIGS. 1A to 1C. FIG. 1A shows a perspective view of an ID chip according to the invention. FIG. 1B is a perspective view where the ID chip shown in FIG. 1A is seen from the back. Reference numeral 100 denotes an integrated circuit, 101 denotes a first conducting wire of an antenna, and 102 denotes a second conducting wire of the antenna. The integrated circuit 100 is formed over the substrate 103.

The first conducting wire 101 and the integrated circuit 100 are formed over one surface of the substrate 103, and the first conducting wire 101 is electrically connected to the integrated circuit 100. The second conductive wire 102 is formed over a surface of the substrate opposite to the surface where the first conducting wire 101 and the integrated circuit 100 are provided. In other words, the first conducting wire 101 and the second conducting wire are formed so as to sandwich the substrate 103.

In FIG. 1A and FIG. 1B, the first conducting wire 101 and the second conducting wire 102 are electrically connected. Further, in FIG. 1A and FIG. 1B, the first conducting wire 101 and the second conducting wire 102 constitute one antenna; however, the invention is not limited to the structure. In the case where the first conducting wire 101 and the second conducting wire 102 respectively constitute different antennas, the first conducting wire 101 and the second conducting wire 102 are electrically isolated. In this case, the second conducting wire 102 is also electrically connected to the integrated circuit 100.

Figure 1C:
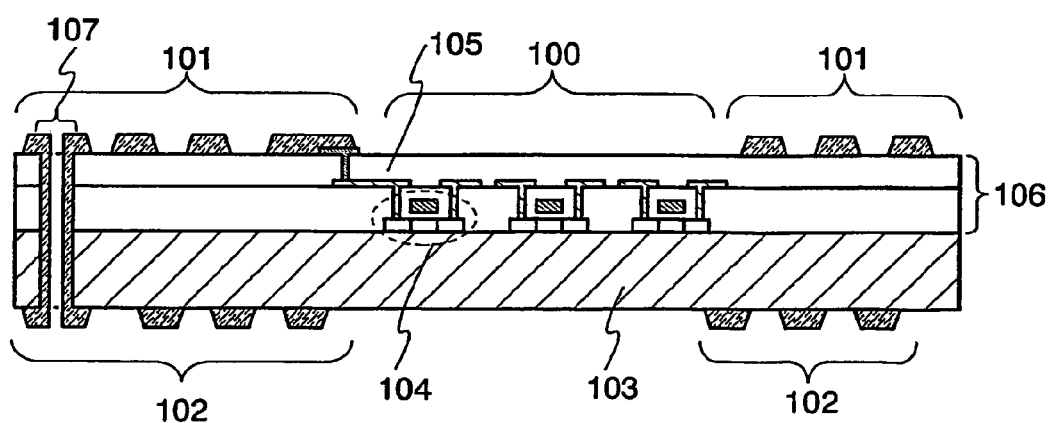

In FIG. 1C, a cross-sectional view of an ID chip shown in FIG. 1A taken along line A-A' is shown. Note that, in FIG. 1C, a TFT (thin film transistor) 104 is shown as an example of a semiconductor element included in the integrated circuit 100. The semiconductor element used for the integrated circuit 100 is not limited to a TFT. For example, a memory element, a diode, a photoelectric conversion element, a resistor element, a coil, a capacitor element, an inductor and the like can be used other than a TFT. The antenna 101 is formed on an interlayer insulating film 105 covering the TFT. Further, as shown in FIG. 1C, various insulating films and conductive films other than the interlayer insulating film 105 are formed to stack over substrate 103. A contact hole 107 is formed in layers 106 including the interlayer insulating film 105 and the substrate 103. In FIG. 1C, the first conducting wire 101 is connected to the second conducting wire 102 through the contact hole 107. The first conducting wire 101 and the second conducting wire 102 may be electrically connected by using a wiring other than the first conducting wire 101 and the second conducting wire 102, or may be connected so that the first conducting wire 101 and the second conducting wire 102 are in direct contact.

As to an ID chip of the invention, a conducting wire to be used as an antenna is not necessarily required to be exposed. Some mode of ID chips of the invention will be described with reference to FIGS. 2A to 2E.

Figure 2A:
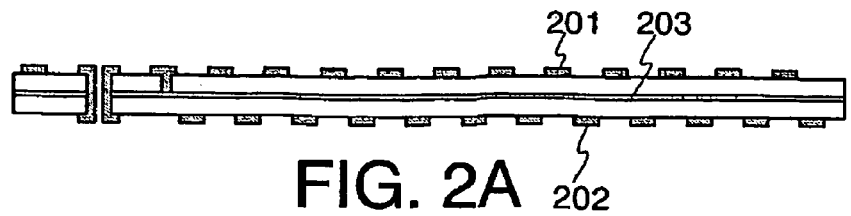
FIGS. 2A to 2E are cross-sectional views of ID chips of the invention.

FIG. 2A shows an cross-sectional view of an ID chip where a first conducting wire 201 and a second conducting wire 202 are exposed same as the ID chip shown in FIG. 1C. An integrated circuit 203 is formed in layer between the first conducting wire 201 and the second conducting wire 202. The integrated circuit 203 may be overlapped with the first conducting wire 201 or the second conducting wire 202; alternatively, it may be formed so as not to overlap with either of them.

Figure 2B:
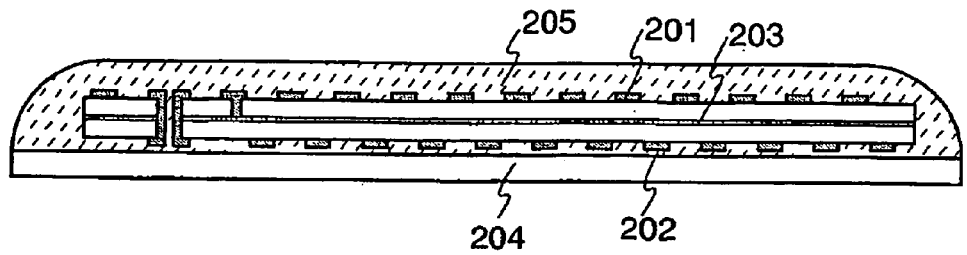

FIG. 2B shows a state where a first conducting wire 201, a second conducting wire 202, and an integrated circuit 203 are mounted on a cover material 204, and are covered with a resin 205. In FIG. 2B, an example of the case where the first conducting wire 201, the second conducting wire 202, and the integrated circuit 203 are fixed onto the cover material 204 only with the resin 205; however, the invention is not limited to the structure. The first conducting wire 201, the second conducting wire 202, and the integrated circuit 203 may be covered with resin 205 after being fixed to the cover material 204 with an adhesive material.

The mechanical strength of an ID chip can be improved by using the structure shown in FIG. 2B.

Figure 2C:
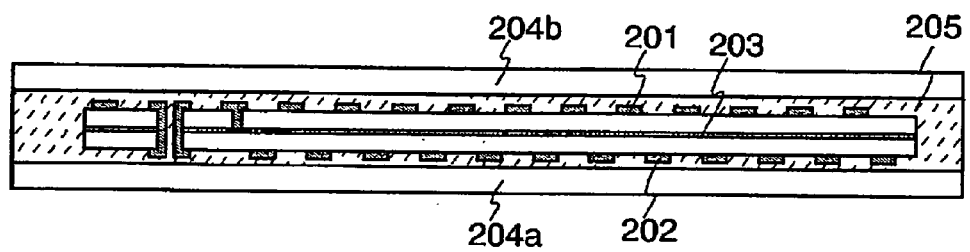

Next, FIG. 2C shows a state where a first conducting wire 201, a second conducting wire 202, and an integrated circuit 203, and a resin 205 are interposed between cover materials 204a and 204b. In FIG. 2C, an example of the case where the first conducting wire 201, the second conducting wire 202, and the integrated circuit 203 are fixed between the cover materials 204a and 204b only with the resin 205; however, the invention is not limited to the structure. The first conducting wire 201, the second conducting wire 202, and the integrated circuit 203, and the resin 205 may be interposed between the two cover materials 204a and 204b after being fixed to either one of the cover materials 204a and 204b with an adhesive material.

The mechanical strength of an ID chip can be improved by using the structure shown in FIG. 2C.

Figure 2D:
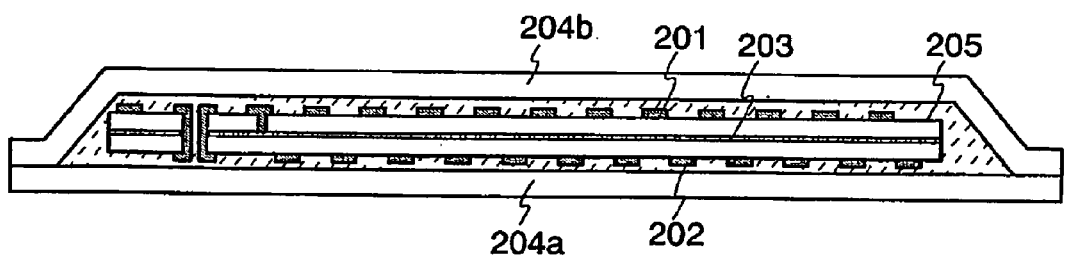

Next, FIG. 2D shows a state where a first conducting wire 201, a second conducting wire 202, an integrated circuit 203 and a resin 205 are interposed between cover materials 204a and 204b. In FIG. 2D, a depression is formed on the cover materials 204a and 204b unlike in FIG. 2C. The depression is overlapped with the first conducting wire 201, the second conducting wire 202, and the integrated circuit 203. Further, in FIG. 2D, an example of the case where the first conducting wire 201, the second conducting wire 202, and the integrated circuit 203 are fixed between the cover materials 204a and 204b only with the resin 205; however, the invention is not limited to the structure. The first conducting wire 201, the second conducting wire 202, and the integrated circuit 203, and the resin 205 may be interposed between the two cover materials 204a and 204b after being fixed to either one of the cover materials 204a and 204b with an adhesive material.

The mechanical strength of an ID chip can be improved by using the structure shown in FIG. 2D.

Figure 2E:
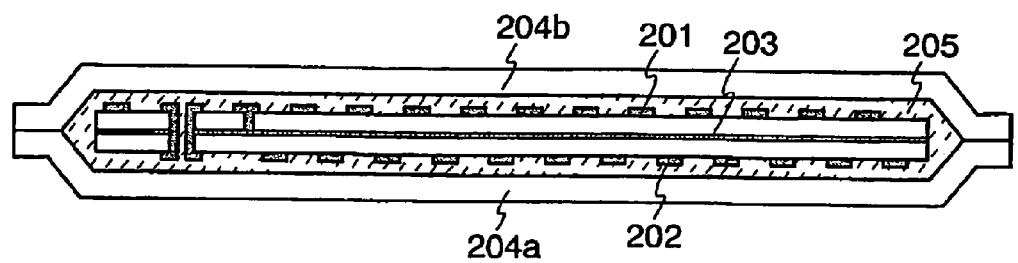

Next, FIG. 2E shows a state where a first conducting wire 201, a second conducting wire 202, an integrated circuit 203, and a resin 205 are interposed between cover materials 204a and 204b. In FIG. 2E, depressions are formed on both of the cover materials 204a and 204b unlike in FIGS. 2C and 2D. The depressions are formed so as to oppose each other, and the first conducting wire 201, the second conducting wire 202, and the integrated circuit 203 are overlapped with the depressions. Further, in FIG. 2E, an example of the case where the first conducting wire 201, the second conducting wire 202, and the integrated circuit 203 are fixed between the cover materials 204a and 204b only with the resin 205; however, the invention is not limited to the structure. The first conducting wire 201, the second conducting wire 202, and the integrated circuit 203 with the resin 205 may be interposed between the two cover materials 204a and 204b after being fixed to either one of the cover materials 204a and 204b with an adhesive material.

The mechanical strength of an ID chip can be improved by using the structure shown in FIG. 2E.

Note that according to the invention, a cover material can be regarded as a part of an ID chip, or can be regarded as an independent member of the ID chip.

Figure 3A:
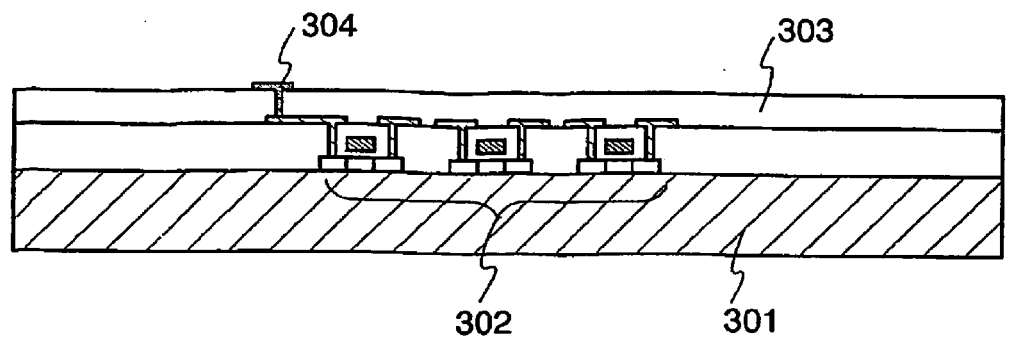
FIGS. 3A to 3D are figures showing a manufacturing method of an ID chip of the invention.

Next, a method for manufacturing an ID chip of the invention will be described. First, semiconductor elements 302 used for an integrated circuit are formed over a substrate 301 as shown in FIG. 3A. Next, an interlayer insulating film 303 is formed to cover the semiconductor elements 302. Then, a wiring 304 that is connected to at least one of the semiconductor element 302 is formed over the interlayer insulating film 303. The wiring 304 may be electrically connected to one of the semiconductor elements 302, or may have direct contact therewith.

Figure 3B:
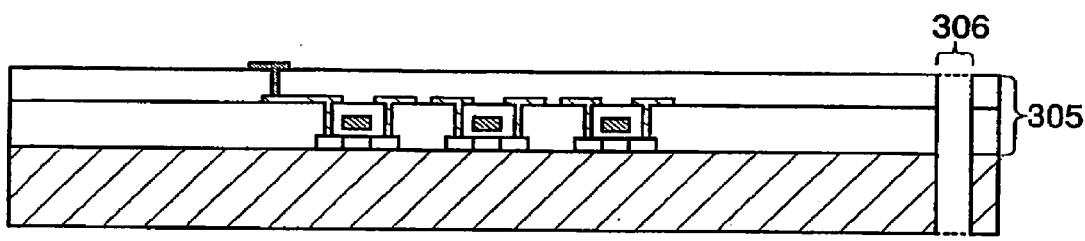

Next, a contact hole 306 is formed so as to pierce the substrate 301 and layers 305 including various insulating films as shown in FIG. 3B. The layers 305 including various insulating films include the interlayer insulating film 303. The formation of the contact hole 306 may be carried out by using a laser such as a $CO_2$ laser, or by etching, for example. The etchant to be used for etching is appropriately selected depending on the materials of the substrate 301 and the various insulating films constituting the layers 305.

For example, in the case where a glass substrate is used for the substrate 301, HF, $HBF_4$, NaOH, $Na_2CO_3$, or the like can be used as an etchant for etching the substrate 301.

Figure 3C:
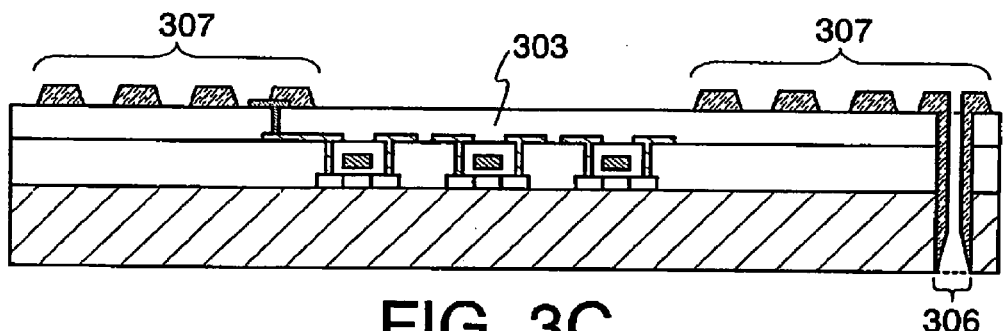

Next, a first conducting wire 307 is formed over the interlayer insulating film 303 as shown in FIG. 3C. The first conducting wire 307 can be formed by a sputtering method, a CVD method, a printing method, a droplet discharge method, or the like. The first conducting wire 307 is formed to contact with the wiring 304. Further, a part of the first conducting wire 307 can reach the inner side of a contact hole 306 by forming the first conducting wire 307 at the portion of the contact hole 306.

The droplet discharge method is a method for forming a predetermined pattern by discharging droplets containing a predetermined composition from a minute hole, which includes an ink-jet method. The printing method includes screen-printing, offset printing and the like.

Figure 3D:
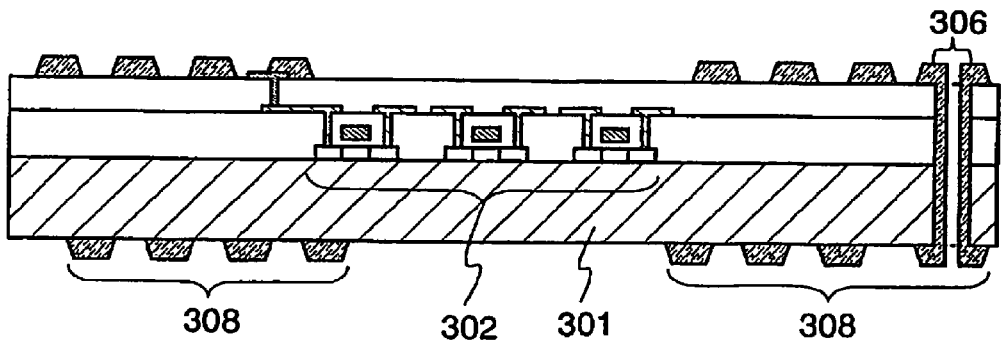

Next, as shown in FIG. 3D, a second conducting wire 308 is formed on a side opposite to the side of a substrate 301 where semiconductor elements 302 are formed. The second conducting wire 308 can be formed by a sputtering method, a CVD method, a printing method, a droplet discharge method, or the like same as with the first conducting wire 307. Further, a part of the second conducting wire 308 can reach the inner side of the contact hole 306 by forming the second conducting wire 308 at the position of the contact hole 306. Consequently, the first conducting wire 307 and the second conducting wire 308 can be connected in the contact hole 306.

After the steps shown in FIG. 3D, the mechanical strength of the ID chip can be improved with the use of a resin or a cover material as shown in FIGS. 2B to 2E.

In FIGS. 3C and 3D, the second conducting wire 308 is formed after forming the first conducting wire 307; however, the first conducting wire 307 may be formed after forming the second conducting wire 308.

Figure 4A:
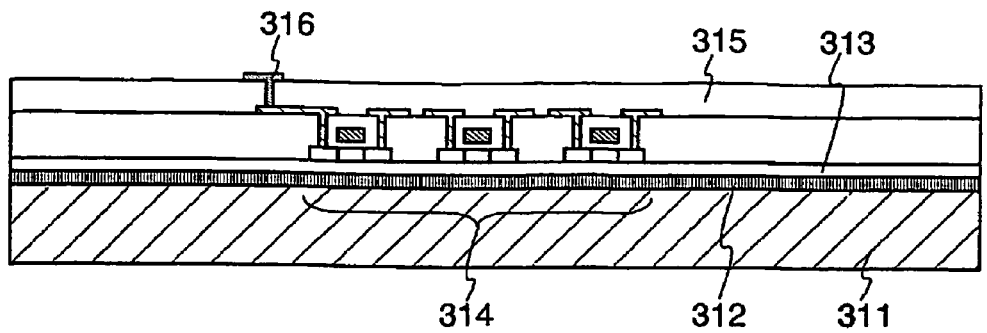
FIGS. 4A to 4E are figures showing a manufacturing method of an ID chip of the invention.

Next, a method for manufacturing an ID chip of the invention, which is different from FIGS. 3A to 3E will be described. First, as shown in FIG. 4A, a separation layer 312 and a base film 313 are sequentially formed over a first substrate 311. It is desirable to use a material that can be later removed by etching or separated by stress for the separation layer 312. The base film 313 is provided so as to prevent alkali metals such as Na or an alkaline earth metal from diffusing into a semiconductor film used for a semiconductor element and adversely affecting the characteristics of the semiconductor element. In addition, the base film 313 also has a function of protecting the semiconductor element in the later step of separating the semiconductor element.

Subsequently, semiconductor elements 314 used for an integrated circuit are formed over the base film 313. Next, an interlayer insulating film 315 is formed to cover the semiconductor elements 314. Then, a wiring 316 that is connected to at least one of the semiconductor element 314 is formed over the interlayer insulating film 315. The wiring 316 may be electrically connected to one of the semiconductor elements 314, or may contact therewith directly.

Figure 4B:
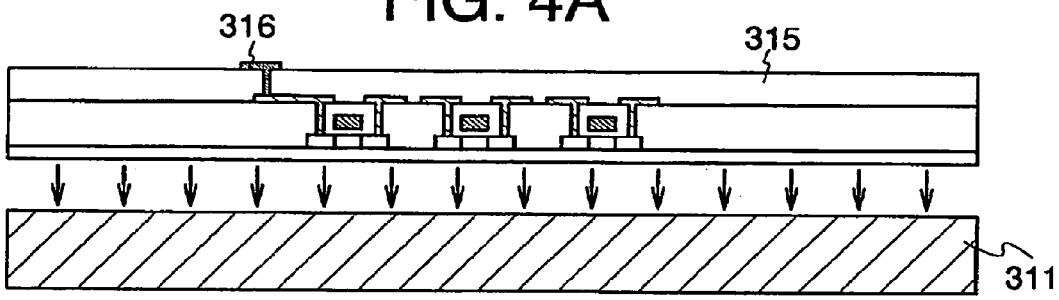

Next, the first substrate 311 is separated from the semiconductor elements 314 by removing or separating the separation layer 312. In FIG. 4B, an example of separating the first substrate 311 by removing the separation layer 312 is shown. In the case of removing the separation layer 312 by etching, a protective layer may be provided to cover the wiring 316 and the interlayer insulating film 315, thereby protecting the 316 and the interlayer insulating film 315 from the etchant.

Figure 4C:
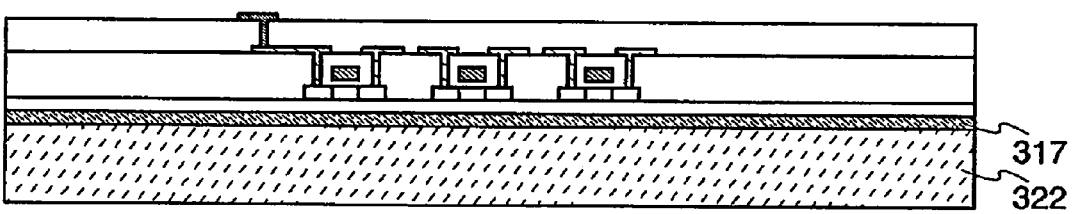

Next, as shown in FIG. 4C, the separated semiconductor elements 314 is attached to a second substrate 322 prepared separately by using an adhesive material. In FIG. 4C, an example of attaching the semiconductor elements 314 to the second substrate 322 with the use of an adhesive 317 is shown.

Figure 4D:
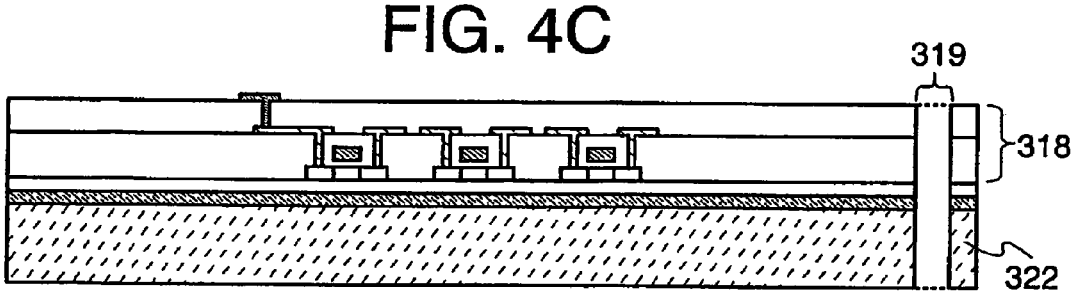

Next, a contact hole 319 is formed so as to pierce the second substrate 322 and layers 318 including various insulating films as shown in FIG. 4D. The layers 318 including various insulating films include the interlayer insulating film 315. In the case of using a plastic substrate for the second substrate 322, the formation of the contact hole 319 may be carried out by using a laser such as a $CO_2$ laser, or by etching. The etchant to be used for etching is appropriately selected depending on the materials of the second substrate 322 and the various insulating films constituting the layers 318.

For example, in the case of using an acrylic substrate for the second substrate 322, the contact hole 319 can be formed by etching with the use of oxygen plasma, or dry etching with the use of $SF_6$ or $CF_4$.

Figure 4E:
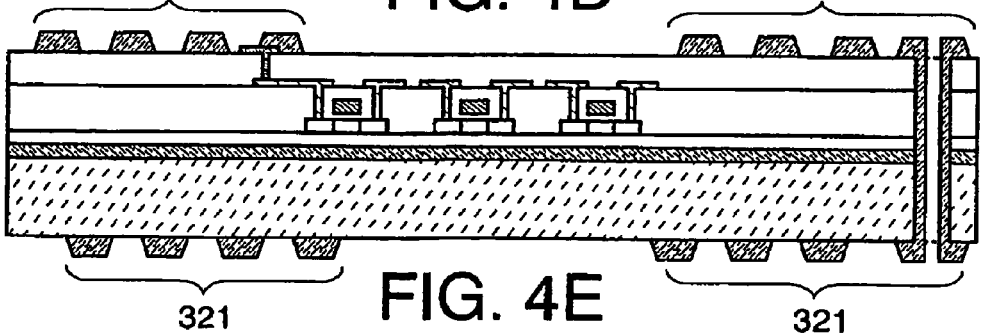

Next, a first conducting wire 320 is formed over the interlayer insulating film 315 as shown in FIG. 4E. The first conducting wire 320 can be formed by a sputtering method, a CVD method, a printing method, a droplet discharge method, or the like. The first conducting wire 320 is formed to contact the wiring 316. Further, a part of the first conducting wire 320 can reach the inner side of a contact hole 319 by forming the first conducting wire 320 at the position of the contact hole 319.

Next, a second conducting wire 321 is formed on a surface opposite to the surface of the second substrate 322 where the semiconductor elements 314 are formed. The second conducting wire 321 can be formed by a sputtering method, a CVD method, a printing method, a droplet discharge method, or the like same as with the first conducting wire 320. Further, a part of the second conducting wire 321 can reach the inner side of the contact hole 319 by forming the second conducting wire 321 at the position of the contact hole 319. Consequently, the first conducting wire 320 and the second conducting wire 321 can be connected in the contact hole 319.

After the step shown in FIG. 4E, the mechanical strength of the ID chip can be improved with the use of a resin or a cover material as shown in FIGS. 2B to 2E.

In FIG. 4E, the second conducting wire 321 is formed after forming the first conducting wire 320; however, the first conducting wire 320 may be formed after forming the second conducting wire 321.

Further, FIGS. 3C, 3D and FIG. 4E show examples of connecting the first conducting wire and the second conducting wire by means of the first conducting wire and the second conducting wire reaching in the contact hole shown; however, the invention is not limited to the structure. The first conducting wire and the second conducting wire may be connected with the use of a plurality of wirings. Alternatively, the first conducting wire and the second conducting wire may be connected with the use of a wiring formed by a damascene process.

Figure 5A:
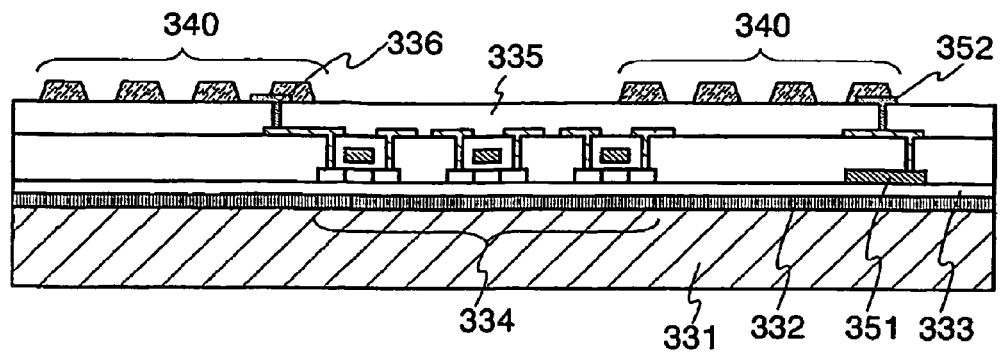
FIGS. 5A to 5D are figures showing a manufacturing method of an ID chip of the invention.

Next, a method for manufacturing an ID chip of the invention, which is different from FIGS. 3A to 4E will be described. First, as shown in FIG. 5A, a separation layer 332 and a base film 333 are sequentially formed over a first substrate 331. It is desirable to use a material that can be later removed by etching or separated by stress for the separation layer 332. The base film 333 is provided so as to prevent alkali metals such as Na or an alkaline earth metal from diffusing into a semiconductor film used for a semiconductor element and adversely affecting the characteristics of the semiconductor element. In addition, the base film 333 also has a function of protecting the semiconductor element in the later step of separating semiconductor elements 334.

Subsequently, semiconductor elements 334 used for an integrated circuit and a wiring 351 are formed over the base film 333. In the case of using top gate TFTs for the semiconductor elements 334, both the gate electrodes of the TFTs and the wiring 351 can be formed by patterning a conductive film. Next, an interlayer insulating film 335 is formed to cover the semiconductor elements 334. Then, wirings 336 and 352 that are connected to at least one of the semiconductor elements 334 are formed over the interlayer insulating film 335. The wiring 336 may be electrically connected to one of the semiconductor elements 334, or may have direct contact therewith. Further, the wiring 352 may be electrically connected with the wiring 351, or may have direct contact therewith.

Next, a first conducting wire 340 is formed over the interlayer insulating film 335. The first conducting wire 340 can be formed by a sputtering method, a CVD method, a printing method, a droplet discharge method, or the like. The first conducting wire 340 is formed to contact the wirings 336 and 352.

Figure 5B:
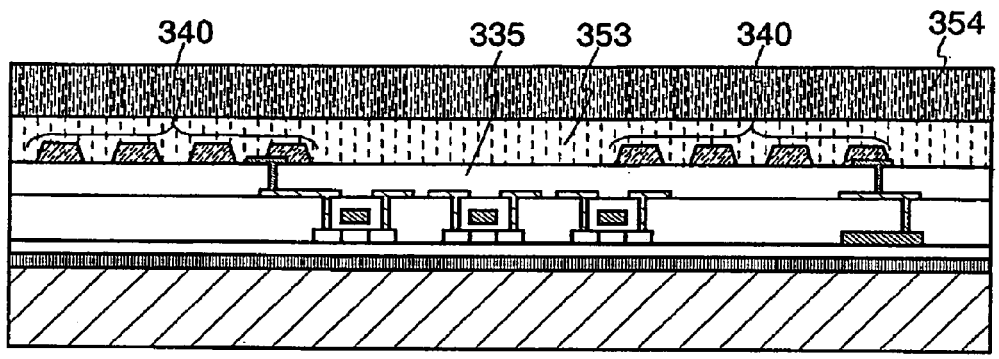

As shown in FIG. 5B, a resin film 353 is formed so as to cover the first conducting wire 340 and the interlayer insulating film 335, and a cover material 354 is attached to the resin film 353.

Figure 5C:
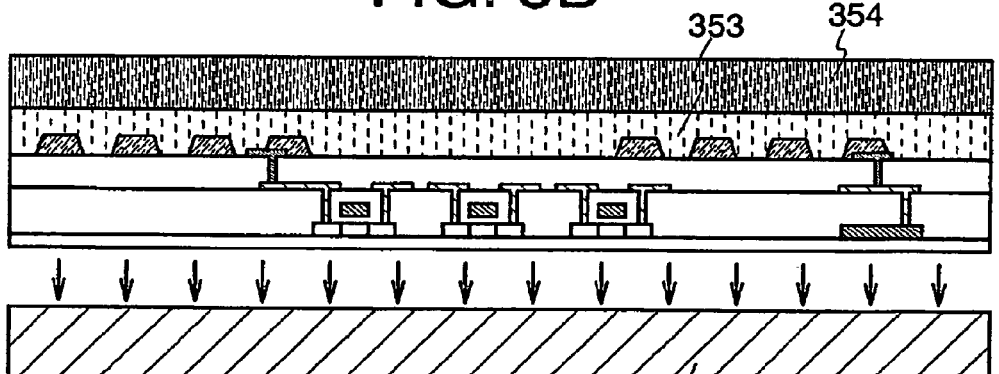

Next, the first substrate 331 is separated from the semiconductor elements 344 by removing or separating the separation layer 332 as shown in FIG. 5C. In FIG. 5C, an example of separating the first substrate 331 by removing the separation layer 332 is shown. In the case of removing the separation layer 332 by etching, an etchant which does not corrode the resin film 353 and the cover material 354 is used.

Figure 5D:
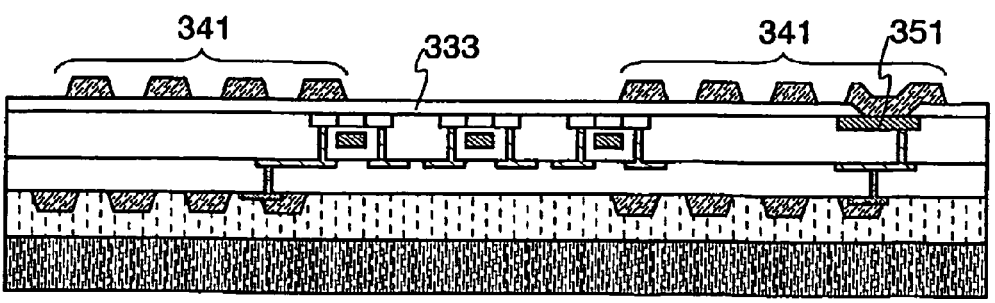

As shown in FIG. 5D, a part of a wiring 351 is exposed by forming a contact hole in a part of the base film 333 by etching or the like. Then, a second conducting wire 341 is formed in contact with the exposed part of the wiring 351 and the base film 333. The second conducting wire 341 can be formed by a sputtering method, a CVD method, a printing method, a droplet discharge method, or the like. When the second conducting wire 341 is formed so as to be in contact with the wiring 351, the first conducting wire 340 and the second conducting wire 341 can be electrically connected.

After the step shown in FIG. 5D, the mechanical strength of the ID chip can be improved by covering the second wiring 341 and the base film with a resin or a cover material as shown in FIGS. 2B to 2E.

Figure 6A:
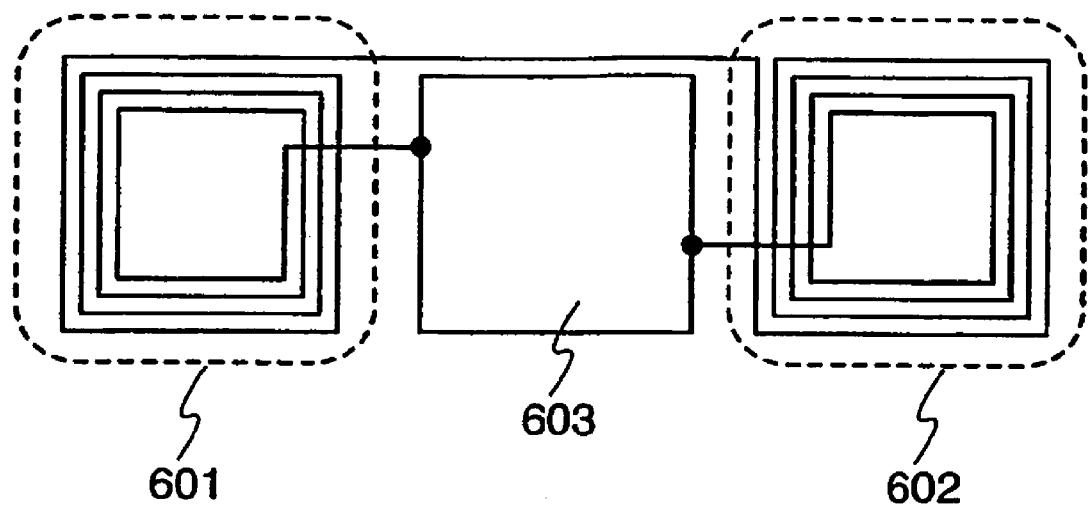
FIGS. 6A and 6B are figures each showing a structure of an ID chip of the invention.

Next, a mode of antennas used for ID chips of the invention will be described. A first conducting wire and a second conducting wire may be connected to each other or may be isolated electrically. FIG. 6A shows a structure of an ID chip of the case where a first conducting wire 601 and a second conducting wire 602 are connected. In FIG. 6A, the first conducting wire 601 and the second conducting wire 602 are used as one antenna by connecting the first conducting wire 601 and the second conducting wire 602. Reference numeral 603 denotes an integrated circuit, and the first conducting wire 601 and the second conducting wire 602 are connected to the integrated circuit 603.

Figure 6B:
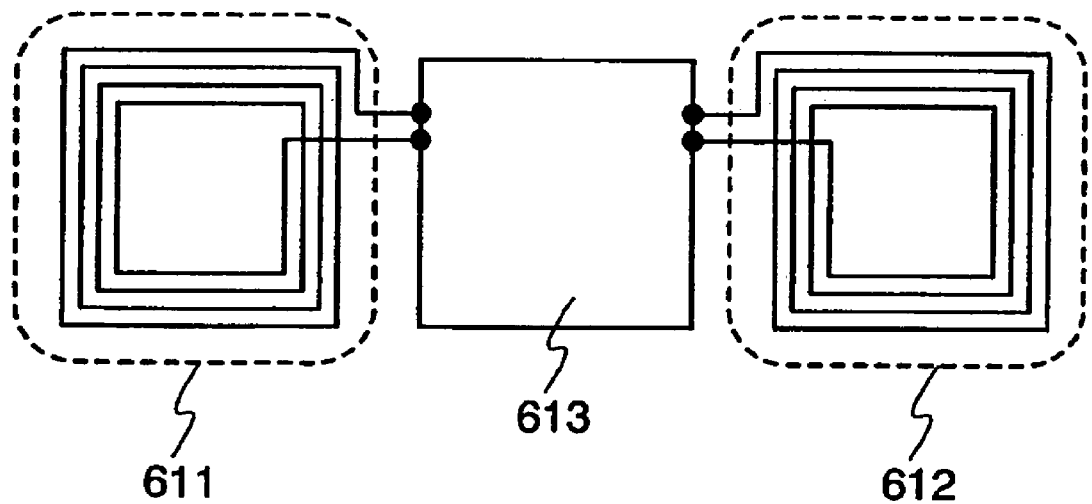

FIG. 6B shows a structure of an ID chip of the case where the first conducting wire 611 and the second conducting wire 612 are electrically isolated. In FIG. 6B, the first conducting wire 611 and the second conducting wire 612 are electrically isolated; therefore the first conducting wire 611 and the second conducting wire 612 can be respectively used as separate antennas. Reference numeral 613 denotes an integrated circuit, and the first conducting wire 611 and the second conducting wire 612 are respectively connected to the integrated circuit 613.

Figure 7:
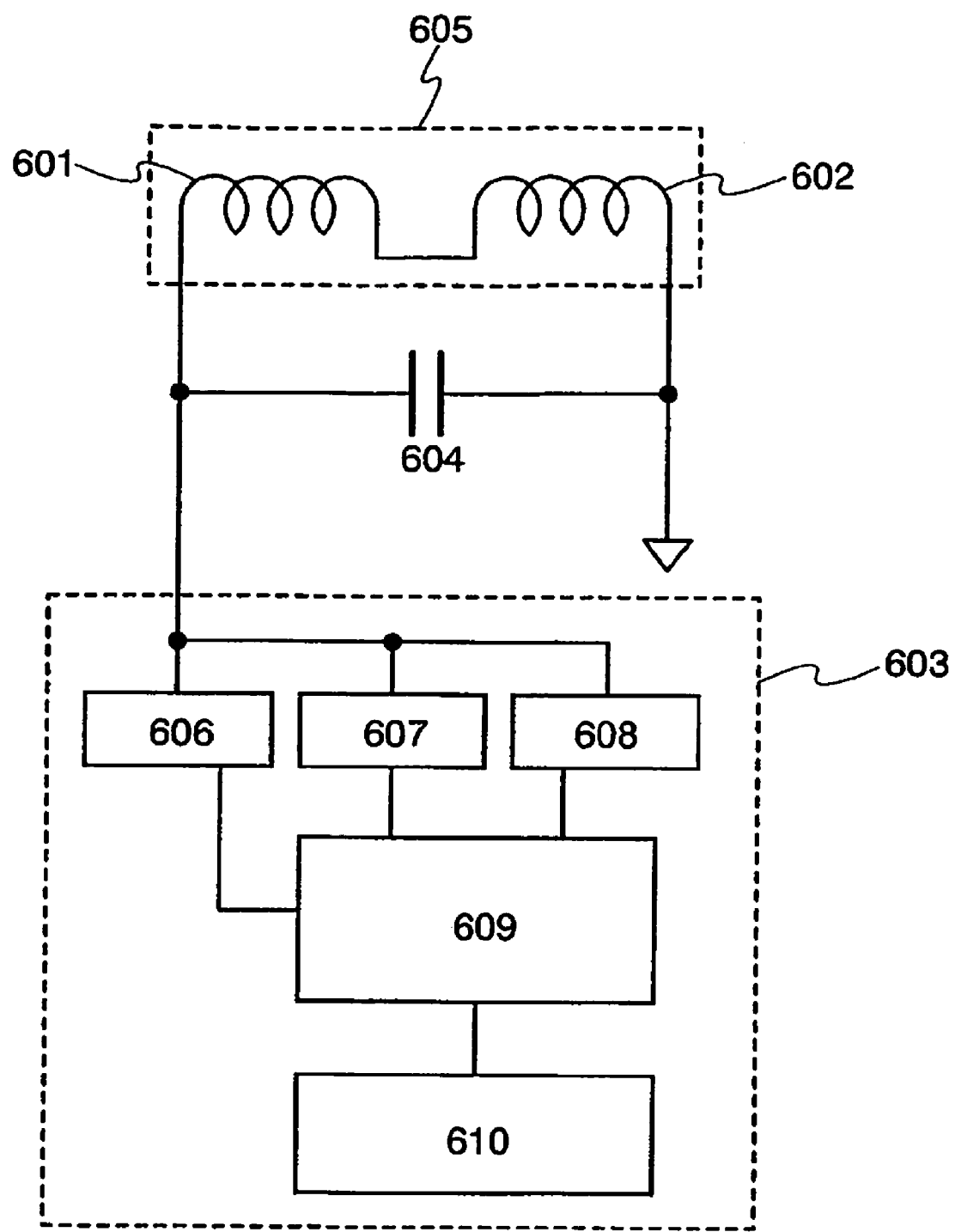
FIG. 7 is a block diagram showing a functional structure of an ID chip of the invention.

FIG. 7 shows a block diagram showing the integrated circuit 603 of an ID chip shown in FIG. 6A.

As for an ID chip shown in FIG. 7, an antenna 605 is formed by connecting a first conducting wire 601 and a second conducting wire 602 in series. Reference numeral 604 denotes a capacitor formed between both terminals of the antenna 605. The integrated circuit 603 includes a demodulation circuit 607, a modulation circuit 608, a rectification circuit 606, a microprocessor 609, and a memory 610. In addition, the number of the memory 610 is not limited to one; a plurality of the memories 610 may be provided instead. As the memory 610, an SRAM, a flash memory, a ROM, an FeRAM (Ferroelectric RAM), or the like may be used.

A signal sent from the reader/writer as a radio wave is converted into an alternating electric signal by electromagnetic induction in the antenna 605. The alternating electric signal is demodulated in the demodulation circuit 607 to be sent to the microprocessor 609 later. Power supply voltage is produced by using an alternating electric signal in the rectification circuit 606 to be supplied to the microprocessor 609 later. Various kinds of arithmetic processing are carried out according to the input signal in the microprocessor 609. The memory 610 stores a program, data or the like to be used in the microprocessor 609. Further, the memory 610 can be used as a workspace for the arithmetic processing.

When data is sent from the microprocessor 609 to the modulation circuit 608, the modulation circuit 608 can apply load modulation to the antenna 605. The reader/writer can eventually read the data from the microprocessor 609 by receiving the load modulation provided to the antenna 605 as a radio wave.

The ID chip is not necessarily required to have the microprocessor 609.

Figure 8:
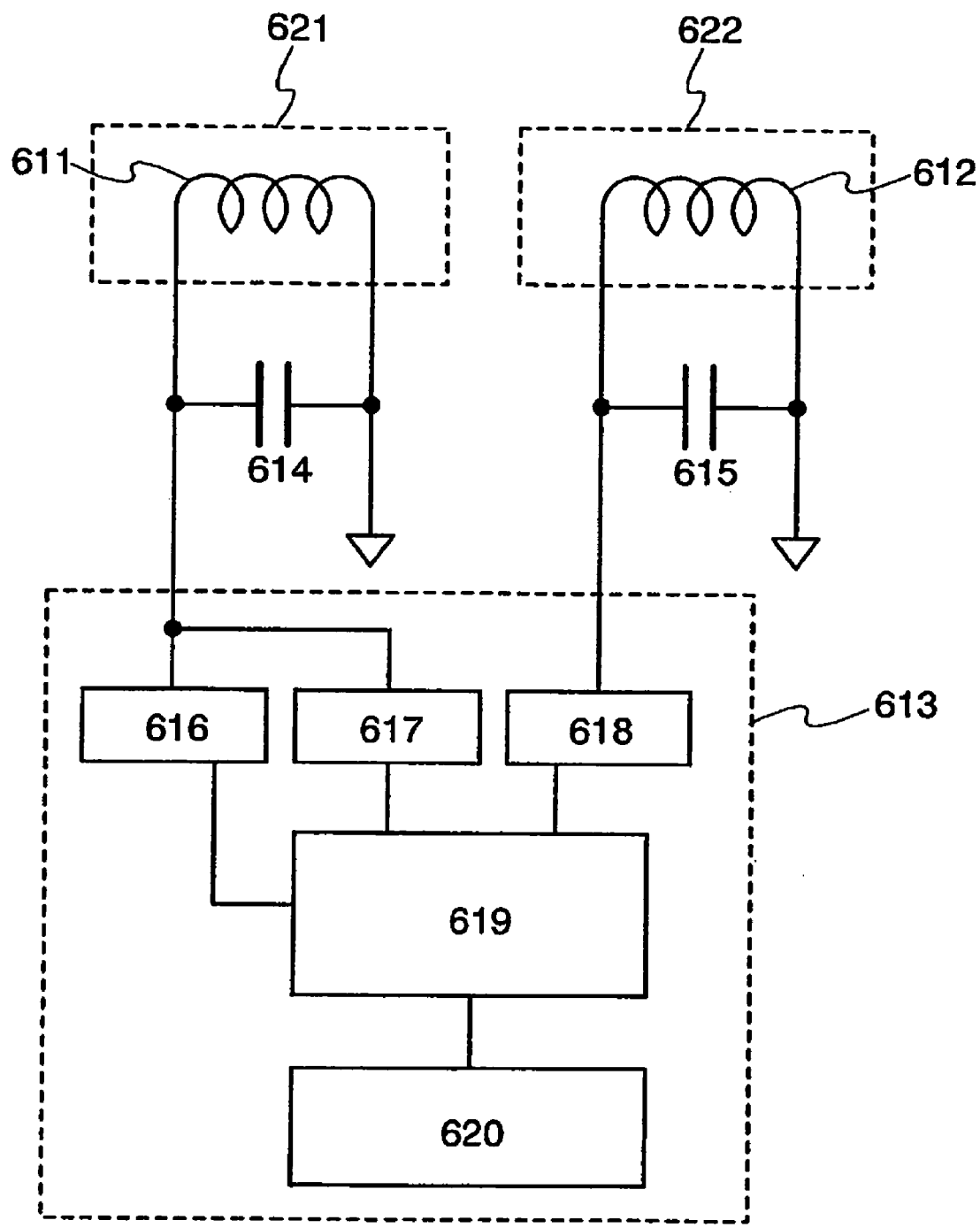
FIG. 8 is a block diagram showing a functional structure of an ID chip of the invention.

FIG. 8 shows a block diagram showing a mode of a functional structure of the ID chip shown in FIG. 6B. The case where an antenna for receiving a signal and supplying power to the integrated circuit 613 is formed with a first conducting wire 611, and another antenna for transmitting a signal is formed with a second conducting wire 612 will be shown in FIG. 8.

As for an ID chip shown in FIG. 8, a first antenna 621 and a second antenna 622 are respectively formed by electrically isolating a first conducting wire 611 and a second conducting wire 612. Reference numeral 614 denotes a capacitor formed between both terminals of the first antenna 621. Reference numeral 615 denotes a capacitor formed between both terminals of the first antenna 622.

The integrated circuit 613 includes a rectification circuit 616, a demodulation circuit 617, a modulation circuit 618, a microprocessor 619, and a memory 620. In addition, the number of the memory 620 is not limited to one; a plurality of the memories 620 may be provided instead. As the memory 620, an SRAM, a flash memory, a ROM, or an FeRAM (registered mark), or the like may be used.

A signal sent from the reader/writer as a radio wave is converted into an alternating electric signal by electromagnetic induction in the first antenna 621. The alternating electric signal is demodulated in the demodulation circuit 617 to be sent to the microprocessor 619 later. Power supply voltage is produced by using an alternating electric signal in the rectification circuit 616 to be supplied to the microprocessor 619 later. Various kinds of arithmetic processing are carried out according to the input signal in the microprocessor 619. The memory 620 stores a program, data or the like to be used in the microprocessor 619. Further, the memory 620 can be used as a workspace for the arithmetic processing.

When data is sent from the microprocessor 619 to the modulation circuit 618, the modulation circuit 618 can apply load modulation to the second antenna 622. The reader/writer can eventually read the data from the microprocessor 619 by receiving the load modulation provided to the second antenna 622 as a radio wave.

The ID chip is not necessarily required to have the microprocessor 619.

Figure 9:
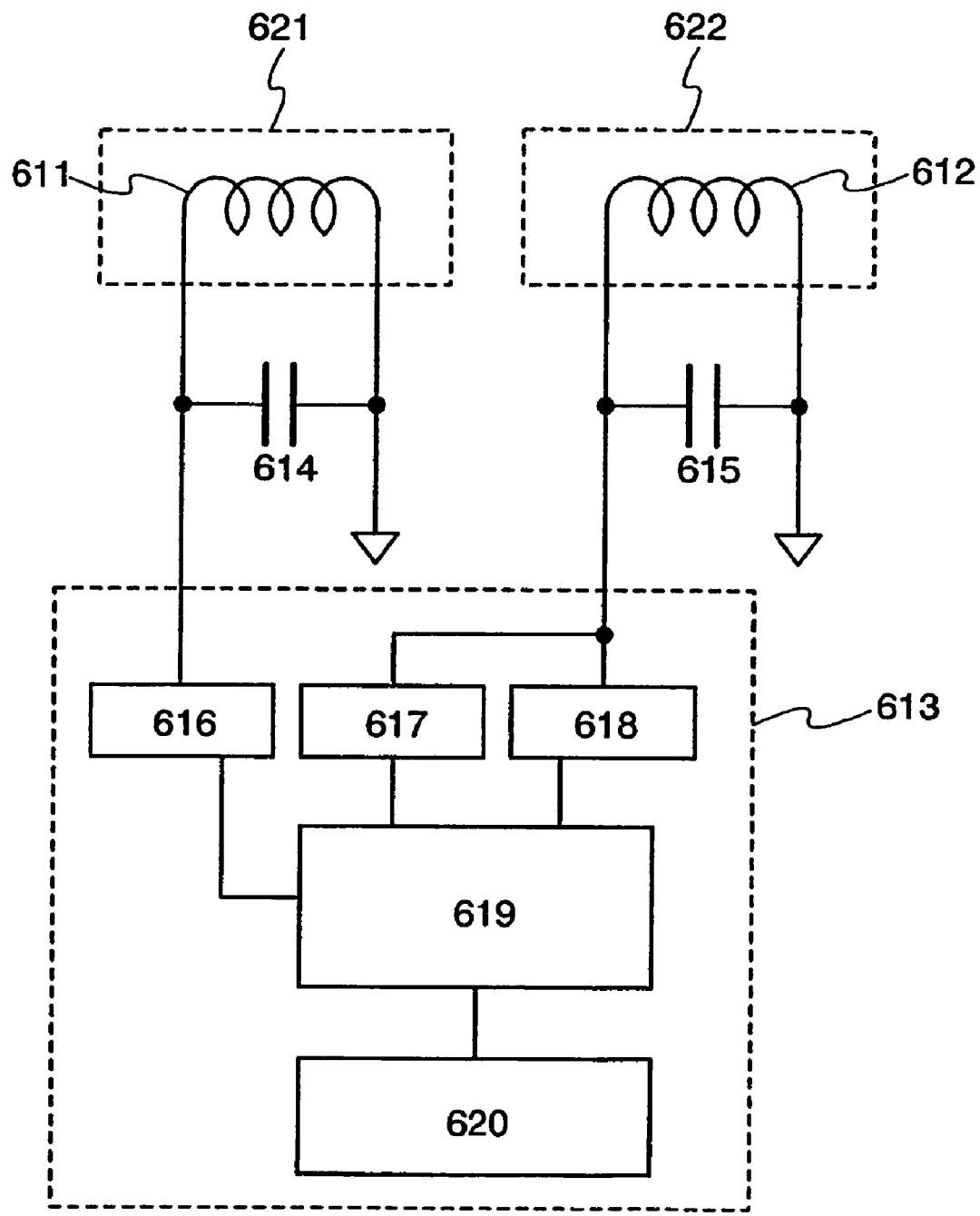
FIG. 9 is a block diagram showing a functional structure of an ID chip of the invention.

FIG. 9 shows a block diagram showing another mode of a functional structure of the ID chip shown in FIG. 6B. However, the case where an antenna for supplying power to the integrated circuit is formed with a first conducting wire 611, and another antenna for transmitting/receiving a signal is formed with a second conducting wire 612 will be shown in FIG. 9.

As for an ID chip shown in FIG. 9, a first antenna 621 and a second antenna 622 are respectively formed by electrically isolating a first conducting wire 611 and a second conducting wire 612 as with the case shown in FIG. 8. Reference numeral 614 denotes a capacitor formed between both terminals of the first antenna 621. Reference numeral 615 denotes a capacitor formed between both terminals of the first antenna 622.

The integrated circuit 613 includes a rectification circuit 616, a demodulation circuit 617, a modulation circuit 618, a microprocessor 619, and a memory 620. In addition, the number of the memory 620 is not limited to one; a plurality of the memories 620 may be provided instead. As the memory 620, an SRAM, a flash memory, a ROM, or an FeRAM (registered mark), or the like may be used.

A signal sent from the reader/writer as a radio wave is converted into an alternating electric signal by electromagnetic induction in the first antenna 621 and the second antenna 622. The alternating electric signal sent from the second antenna 622 is demodulated in the demodulation circuit 617 to be sent to the microprocessor 619 later. Power supply voltage is produced by using an alternating electric signal sent from the first antenna 621 in the rectification circuit 616 to be supplied to the microprocessor 619 later. Various kinds of arithmetic processing are carried out according to the input signal in the microprocessor 619. The memory 620 stores a program, data or the like to be used in the microprocessor 619. Further, the memory 620 can be used as a workspace for the arithmetic processing.

When data is sent from the microprocessor 619 to the modulation circuit 618, the modulation circuit 618 can apply load modulation to the second antenna 622. The reader/writer can eventually read the data from the microprocessor 619 by receiving the load modulation provided to the second antenna 622 as a radio wave.

The ID chip is not necessarily required to have the microprocessor 609.

The cases where the signal transmission is a signal is transmitted by electromagnetic coupling are shown in FIGS. 6A to 9. However, an ID chip according to the invention may use another transmission system using electromagnetic induction or a microwave.

Further in this embodiment mode, the case where the antenna has a conducting wire that is coiled circularly or spirally has been described; however, the invention is not limited to the structure. Alternatively, a film formed of a conductor (conductive film) may be used as an antenna.

Embodiment 1

A specific method for manufacturing an ID chip of the present invention will be described. In this embodiment, a TFT is given as an example of a semiconductor element. However, the semiconductor element used in an integrated circuit is not limited thereto and various circuit elements can be used.

Figure 10A:
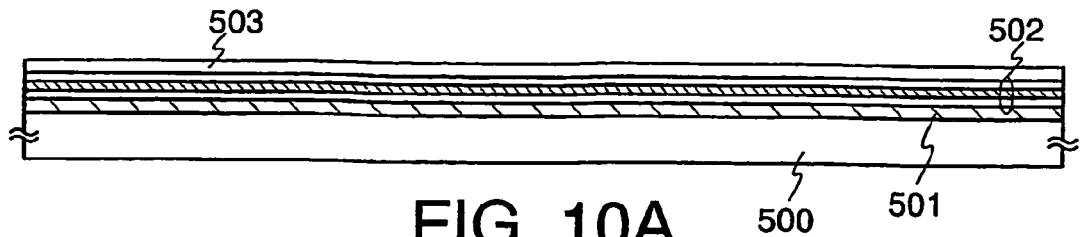
FIGS. 10A to 10E are figures showing a manufacturing method of an ID chip according to the invention.

As shown in FIG. 10A, a separation layer 501 is formed over a first substrate 500 which is heat resistant. For example, a glass substrate such as a barium borosilicate glass or an alumino borosilicate glass, a quartz substrate, a ceramic substrate, or the like can be used for the first substrate 500. In addition, a metal substrate including a SUS substrate or a semiconductor substrate may be used. A substrate made from a flexible synthetic resin such as plastic generally tends to be less resistant to high temperature as compared with the above described substrates. However, such a substrate made from synthetic resin can be used as long as it can resist the processing temperature in the manufacturing steps.

An amorphous silicon film, a polycrystalline silicon film, a single crystal silicon film, a micro crystalline silicon film (including a semiamorphous silicon film) and the like which mainly include silicon can be used for the separation layer 501. The separation layer 501 can be formed by a sputtering method, a low pressure CVD method, a plasma CVD method, or the like. In this embodiment, an amorphous silicon film with a thickness of about 50 nm is formed by a plasma CVD method and is used as the separation layer 501. It is more effective to form the separation layer 501 by a CVD method than by a sputtering method in reducing contaminants contained in the separation layer 501 and reducing Ar in the separation layer 501. Therefore, even when the separation layer 501 is heat treated in laser crystallization process and the like in subsequent steps, the separation of the separation layer 501 from a base film 502 to be formed later due to contaminants and Ar can be prevented. The separation layer 501 is not limited to silicon and materials that can be selectively removed by etching may be used. The thickness of the separation layer 501 is preferably 10 nm to 100 nm.

Next, the base film 502 is formed over the separation layer 501. The base film 502 is provided to prevent an alkali metal such as Na or an alkaline earth metal contained in the first substrate 500 from diffusing into the semiconductor film and adversely affecting characteristics of the semiconductor element such as a TFT. In addition, the base film 502 also has a function of protecting the semiconductor element in the later step of separating the semiconductor element. An insulating film such as a silicon oxide film, a silicon oxynitride film, a silicon nitride film, or a silicon nitride oxide film, for example, can be used for the base film 502.

The base film 502 may have a single layer or a plurality of layered insulating films. In this embodiment mode, a silicon oxynitride film of 100 nm thick, a silicon nitride oxide film of 50 nm thick, and a silicon oxynitride film of 100 nm are sequentially stacked to form the base film 502. The material and thickness of each film, the number of layers are not limited thereto. For example, instead of the silicon oxynitride film in the lower layer, a siloxane resin of 0.5 μm to 3 μm in film thickness may be formed by a spin coating method, a slit coating method, a droplet discharge method, a printing method, or the like. Instead of the silicon nitride oxide film in the middle layer, a silicon nitride film (such as SiNx or $Si_3N_4$) may be formed. Instead of the silicon oxynitride film in the upper layer, a silicon oxide film may be used. In addition, the thickness of each film is preferably 0.05 μm to 3 μm and can be freely selected from the range of 0.05 μm to 3 μm.

Alternatively, the lower layer of the base film 502 which is nearest to the separation layer may be formed with a silicon oxynitride film or a silicon oxide film, the middle layer may be formed with a siloxane resin film, and the upper layer may be formed with a silicon oxide film.

A siloxane resin is equivalent to a resin including Si—O—Si bonds. Siloxane has a skeleton formed by the bond of silicon (Si) and oxygen (O). An organic group containing at least hydrogen (such as an alkyl group or aromatic hydrocarbon) is used as a substituent. Alternatively, a fluoro group may be used as the substituent. Further alternatively, a fluoro group and an organic group containing at least hydrogen may be used as the substituent.

The silicon oxide film can be formed by a thermal CVD method, a plasma CVD method, an atmospheric pressure CVD method, a bias ECRCVD method, or the like using a gas mixture of $SiH_4$ and $O_2$, TEOS (tetraethoxysilane) and $O_2$, or the like. The silicon nitride film can typically be formed by a plasma CVD method using a gas mixture of $SiH_4$ and $NH_3$. In addition, the silicon oxynitride film and the silicon nitride oxide film can typically be formed by a plasma CVD method using a gas mixture of $SiH_4$ and $N_2O$.

Next, a semiconductor film 503 is formed on the base film 502. Desirably, the semiconductor film 503 is formed without being exposed to the air after forming the base film 502. The thickness of the semiconductor film 503 is set to be 20 to 200 nm (desirably, 40 to 170 nm, more preferably, 50 to 150 nm). The semiconductor film 503 may be an amorphous semiconductor, a semiamorphous semiconductor or a polycrystalline semiconductor. Silicon germanium other than silicon can also be used for the semiconductor film. In the case of using silicon germanium, the concentration of germanium is preferably set to be about 0.01 to 4.5 atomic %.

The semiconductor film 503 may be crystallized by a known method. A laser crystallization method using laser light and a crystallization method using a catalytic element are given as known crystallization methods. Alternatively combination of the crystallization method using a catalytic element and the laser crystallization method can be used. In the case where an excellent heat resistant substrate like a quartz substrate is used as the first substrate 500, any one of a thermal crystallization method using an electrically-heated furnace, a lamp annealing crystallization method using an infrared light, and the crystallization method using a catalytic element may be combined with high temperature annealing of about 950° C. as a crystallization method.

In the case of using laser crystallization, for example, the semiconductor film 503 is subjected to thermal annealing at 550° C. for four hours to enhance resistance to a laser beam before performing laser crystallization. A continuous wave solid-state laser is used and a laser beam with one of the second to fourth harmonics of the fundamental frequency is applied to obtain a crystal with a large grain size. Typically, for instance, the second harmonic (532 nm) or the third harmonic (355 nm) of Nd:$YVO_4$ laser (fundamental wave: 1064 nm) is preferably used. Specifically, a laser beam emitted from the continuous wave $YVO_4$ laser is converted into a harmonic by a nonlinear optical element to obtain a laser beam with 10 W output. The laser beam is preferably formed to have a rectangular spot or an elliptical spot on a surface of the semiconductor film 503 to be irradiated with the laser beam. In this case, the power density of about 0.01 to 100 $MW/cm^2$ (preferably, 0.1 to 10 $MW/cm^2$) is required. The scanning rate is approximately set to be about 10 to 2,000 cm/s to irradiate the semiconductor film.

Laser crystallization may be carried out using a pulsed laser beam with a repetition rate of 10 MHz or more, that is in a much higher frequency band than a generally used frequency band of several tens Hz to several hundred Hz. The period from irradiation of the semiconductor film with a pulsed laser beam to complete solidification of the semiconductor film is considered to be several tens ns to several hundred ns. By using the above-mentioned frequency band, the next pulsed laser beam can be applied to the semiconductor film by the time when the semiconductor film is melted due to the irradiation with a laser beam to be solidified. Therefore, a solid-liquid interface can be continuously moved in the semiconductor film, so that the semiconductor film having crystal grains, which are continuously grown in the scanning direction, is formed. Specifically, an aggregate of crystal grains each of which has a width of 10 to 30 μm in a scanning direction and a width of 1 to 5 μm in a direction perpendicular to the scanning direction can be obtained. The semiconductor film in which almost no crystal grain boundaries are formed at least in the channel direction of a TFT can be formed by forming the single crystal grains growing in the scanning direction.

As for the laser crystallization, laser light of the fundamental wave of a continuous wave laser and laser light of the harmonic of a continuous wave laser may be applied in parallel. Alternatively, laser light of the fundamental wave of a continuous wave laser and laser light of the harmonic of a pulsed laser may be applied in parallel.

A laser beam may be applied under an atmosphere of an inert gas such as rare gas or nitrogen. Thus, surface roughness of the semiconductor due to the laser irradiation can be reduced and fluctuation of a threshold value due to the fluctuation of interface state density can be suppressed.

By the above described laser irradiation, the semiconductor film 503 with enhanced crystallinity is formed. Note that a polycrystalline semiconductor may be formed in advance by a sputtering method, a plasma CVD method, a thermal CVD method, or the like.

The semiconductor film 503 is crystallized in this embodiment; however, an amorphous silicon film or a microcrystalline semiconductor film may be used in the following process without performing the crystallization. A TFT using an amorphous semiconductor or a microcrystalline semiconductor needs fewer manufacturing steps than a TFT using a polycrystalline semiconductor, which is advantageous in reducing costs and improving yield.

An amorphous semiconductor can be obtained by performing glow discharge decomposition of a silicide gas. Typically, $SiH_4$ and $Si_2H_6$ are used for the silicide gas. These silicide gases may be diluted with hydrogen or hydrogen and helium.

A semiamorphous semiconductor has an intermediate structure between an amorphous structure and a crystalline structure (including a single crystalline structure, and a polycrystalline structure), and a third state that is stable in terms of free energy. Such a semiamorphous semiconductor has a crystal structure that includes a short range order and lattice distortion. Crystal grains with a diameter of 0.5 nm to 20 nm can be contained and dispersed in a non-single crystal semiconductor. As for the semiamorphous semiconductor, the Raman spectrum derived from L-O phonon shifts to the side of a wave number lower than 520 $cm^{-1}$, and a diffraction peak of (111) and (220) derived from a silicon crystal lattice is observed in x-ray diffraction. Further, the semiamorphous semiconductor contains hydrogen or halogen of 1 atomic % or more for terminating a dangling bond. Herein, the semiamorphous semiconductor is referred to as a SAS for convenience. When a rare gas element such as helium, argon, krypton, or neon is mixed into a SAS (semiamorphous semiconductor), the lattice distortion is further increased and the stability is thus enhanced, thereby obtaining an excellent semiamorphous semiconductor (SAS).

The SAS is formed by glow discharge decomposition of a silicide gas. $SiH_4$ is a typical silicide gas. In addition, $SiH_4$, $Si_2H_6$, $SiH_2Cl_2$, $SiHCl_3$, $SiCl_4$, $SiF_4$, or the like can be used as the silicide gas. The silicide gas may also be diluted with hydrogen, or a mixture of hydrogen and one or more rare gas elements of helium, argon, krypton, and neon, so that the SAS can be easily formed. The dilution ratio is preferably set to be in the range of 1:2 to 1:1,000. In addition, a carbide gas such as $CH_4$ and $C_2H_6$ or germanium gas such as $GeH_4$ or $GeF_4$, or $F_2$ may be mixed in the silicide gas so that the width of the energy band may be adjusted in the range of 1.5 to 2.4 eV or 0.9 to 1.1 eV.

In the case of using a gas containing a mixture of $SiH_4$ and $H_2$ or a gas containing a mixture of $SiH_4$ and $F_2$, for example, when a TFT is manufactured using the semiamorphous semiconductor, the subthreshold coefficient (S value) of the TFT can be 0.35 V/s or lower, typically, 0.25 to 0.09 V/s, and the field effect mobility thereof can be 10 cm$^2$/Vs. For example, in the case where a 19-stage ring oscillator is formed by using the TFTs with the above semiamorphous semiconductor, a characteristic of the oscillation frequency of 1 MHz or more, preferably 100 MHz or more at the power supply voltage of 3 to 5 V can be obtained. In addition, the delay time for each stage of an inverter can be 26 ns, preferably 0.26 ns or less at the power supply voltage of 3 to 5 V.

Figure 10B:
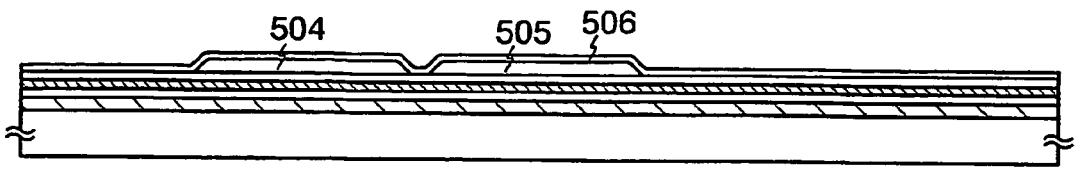

Next, as shown in FIG. 10B, the crystallized semiconductor film 503 is patterned to form island-like semiconductor films 504 and 505. A gate insulating film 506 is formed to cover the island-like semiconductor films 504 and 505. A film containing silicon nitride, silicon oxide, silicon nitride oxide, or silicon oxynitride can be formed into a single layer or a stack as the gate insulating film 506 by a plasma CVD method or a sputtering method. In stacking the films, for example, a three-layer structure of a silicon oxide film, a silicon nitride film, and a silicon oxide film in order from the substrate side is preferably used.

Figure 10C:
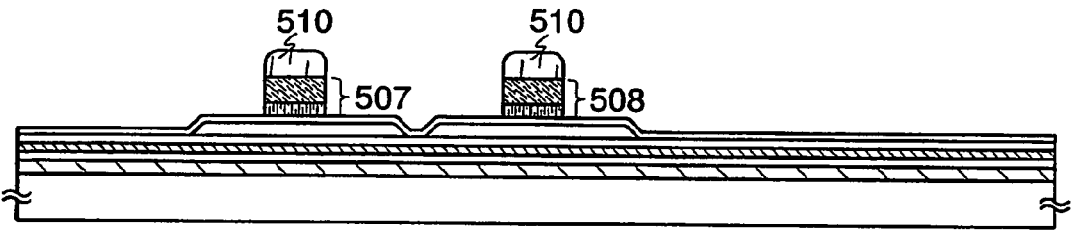

Next, as shown in FIG. 10C, gate electrodes 507 and 508 are formed. In this embodiment, after forming Si doped with an n-type impurity, WN, and W by a sputtering method to be layered, the gate electrodes 507 and 508 are formed by etching using a resist 510 as masks. Of course, the material, structure, and manufacturing method of the gate electrodes 507 and 508 are not limited thereto and can be selected appropriately. For example, a layered structure of NiSi (nickel silicide) and Si doped with an n-type impurity, or a layered structure of TaN (tantalum nitride) with W (tungsten) may be used. In addition, the gate electrode may be formed as a single layer of various conductive materials.

A mask of silicon oxide or the like may be used instead of a resist mask. In this case, a step of patterning is added to form a mask of silicon oxide, silicon oxynitride, or the like (called a hard mask) is added. However, the thickness of the mask reduced by etching is less than that of a resist mask. Thus, the gate electrodes 507 and 508 with a desired width can be formed. Alternatively, the gate electrodes 507 and 508 may be selectively formed by a droplet discharge method without using the resist 510.

Various materials can be selected as the conductive material according to the function of the conductive film. If the gate electrode and the antenna are formed simultaneously, the materials may be selected considering the function.

A gas mixture of $CF_4$, $Cl_2$, and $O_2$ or a $Cl_2$ gas is used as an etching gas in forming the gate electrodes by etching; however, the etching gas is not limited to those.

Figure 10D:
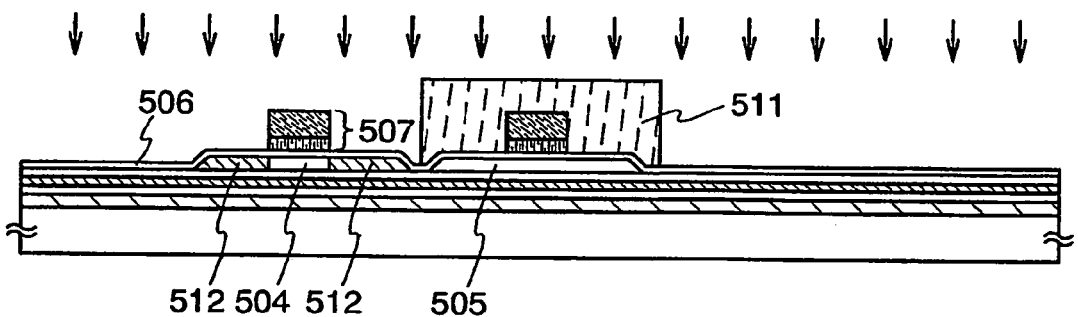

Next, as shown in FIG. 10D, the island-like semiconductor film 505 to be a p-channel TFT is covered with a resist 511 and an n-type impurity element (typically, phosphorus (P) or arsenic (As)) is added to the island-like semiconductor film 504 at a low concentration using the gate electrode 507 as a mask (the first doping step). The conditions of the first doping step are as follows: the dose amount of $1\times10^{13}$ to $6\times10^{13}$ atoms/cm$^2$, and the accelerating voltage of 50 to 70 kV. However, the conditions are not limited thereto. A pairs of low concentration impurity regions 512 is formed in the island-like semiconductor film 504 by doping through the gate insulating film 506 in the first doping step. Note that the first doping step may be conducted without covering the island-like semiconductor 505 to be a p-channel TFT with a resist.

Figure 10E:
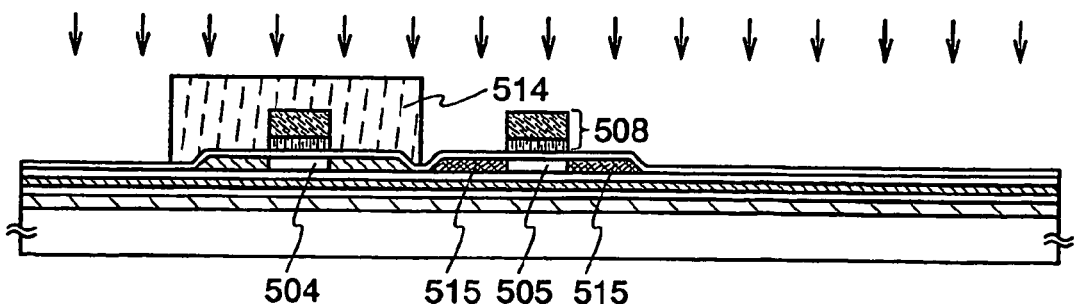

Next, as shown in FIG. 10E, after the resist 511 is removed by ashing or the like, a new resist mask 514 is formed to cover the island-like semiconductor film 504 to be an n-channel TFT. A p-type impurity element (typically, boron (B)) is added into the island-like semiconductor film 505 at a high concentration using the gate electrode 508 as a mask (the second doping step). The conditions of the second doping step are as follows: the dose amount of $1\times10^{16}$ to $3\times10^{16}$ atoms/cm$^2$, and the accelerating voltage of 20 to 40 kV. A pair of p-type high concentration impurity regions 515 is formed in the island-like semiconductor film 505 by doping, through the gate insulating film 506 by performing the second doping step.

Figure 11A:
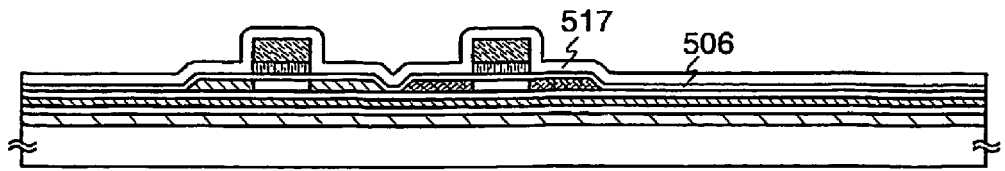
FIGS. 11A to 11E are figures showing a manufacturing method of an ID chip according to the invention.
Figure 11B:
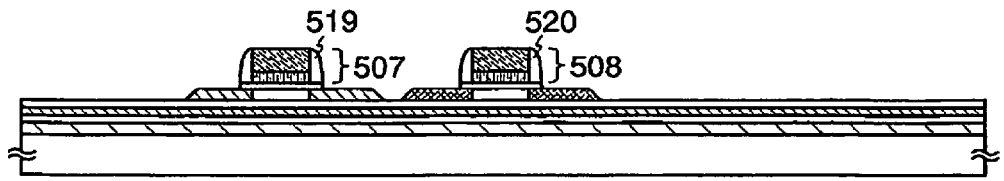

Next, as shown in FIG. 11A, after the resist 514 is removed by ashing or the like, an insulating film 517 is formed to cover the gate insulating film 506 and the gate electrodes 507 and 508. In this embodiment, a silicon oxide film of 100 nm thick is formed by a plasma CVD method. After that, the insulating film 517 and the gate insulating film 506 are partially etched by etchback. As shown in FIG. 11B, sidewalls 519 and 520 are formed in a self-aligned manner to be in contact with the sidewalls of the gate electrodes 507 and 508. A gas mixture of $CHF_3$ and He is used as the etching gas. Note that the steps of forming the sidewalls are not limited thereto.

When forming the insulating film 517, an insulating film may be formed also over the backside of the first substrate 500. In this case, the insulating film formed over the rear backside of the first substrate 500 may be selectively etched and removed by using a resist mask. In this case, the resist mask may be etched and removed together with the insulating film 517 and the gate insulating film 506 in forming the sidewalls 519 and 520 by etchback.

Figure 11C:
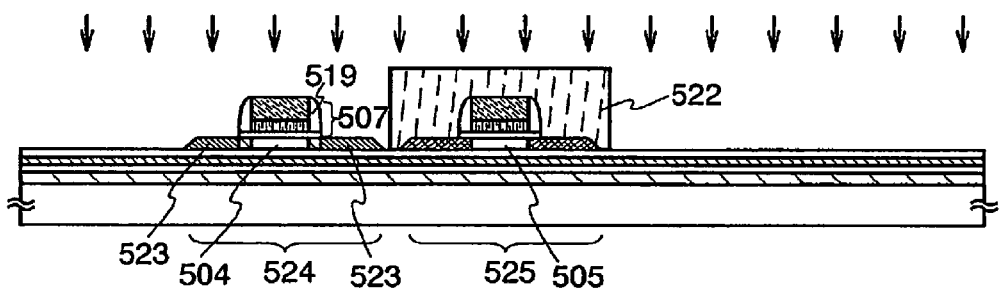

As shown in FIG. 11C, a new resist mask 522 is formed to cover the island-like semiconductor 505 to be a p-channel TFT, an n-type impurity element (typically, P or As) is added at a high concentration using the gate electrode 507 and the sidewall 519 as masks (the third doping step). The conditions of the third doping step are as follows: the dose amount of $1\times10^{13}$ to $5\times10^{15}$ atoms/cm$^2$, and the accelerating voltage of 60 to 100 kV. A pair of n-type high concentration impurity regions 523 is formed in the island-like semiconductor film 504 by performing the third doping step.

When n-type impurities are doped so as to form a high concentration region, the sidewalls 519 function as masks to form low concentration impurity regions or off-set regions which are undoped in a lower part of the sidewalls 519. Therefore, the size of the sidewalls 519 may be adjusted by appropriately changing the conditions of etchback in forming the sidewalls 519 or the thickness of the insulating film 517, so as to control the width of the low concentration impurity regions or the off-set regions.

After the resist mask 522 is removed by ashing or the like, the impurity regions may be activated by a heat treatment. For example, after a silicon oxynitride film of 50 nm is formed, a heat treatment may be carried out in a nitrogen atmosphere at 550° C. for four hours.

After a SiNx film containing hydrogen is formed to have the thickness of 100 nm, heat treatment may be carried out in a nitrogen atmosphere at 410° C. for one hour to hydrogenate the island-like semiconductor films 504 and 505. Alternatively, heat treatment may be performed at a temperature from 300° C. to 450° C. for 1 to 12 hours in an atmosphere containing hydrogen to hydrogenate the island-like semiconductor films 504 and 505. As another hydrogenation method, plasma hydrogenation (using hydrogen excited by plasma) may be performed. Through the hydrogenation step, dangling bonds can be terminated by the thermally excited hydrogen. If defects are caused in the semiconductor film by bending a second substrate 541 after attaching the semiconductor elements to the flexible second substrate 541 in the subsequent step, the concentration of hydrogen contained in the semiconductor film is set at $1\times10^{19}$ to $1\times10^{22}$ atoms/cm³, preferably, $1\times10^{19}$ to $5\times10^{20}$ atoms/cm³ by the hydrogenation, so that the defects can be terminated by the hydrogen contained in the semiconductor film. In addition, halogen may be contained in the semiconductor film to terminate the defects.

Through the above described series of steps, an n-channel TFT 524 and a p-channel TFT 525 are formed. In the above described manufacturing steps, the conditions of etchback or the thickness of the insulating film 517 are changed appropriately and the sizes of the sidewalls are controlled to form TFTs with a lightly doped region length of 0.2 μm to 2 μm. It is noted that, in this embodiment, although a top gate structure is used for the TFTs 524 and 525; however, a bottom gate structure (an inverted staggered structure) may be used instead.

Further, a passivation film for protecting the TFTs 524 and 525 may be formed thereafter. The passivation film is preferably formed by using silicon nitride, silicon nitride oxide, aluminum nitride, aluminum oxide, silicon oxide, or the like which can prevent an alkali metal or an alkaline earth metal from entering the TFTs 524 and 525. Specifically, for example, a silicon oxynitride film of about 600 nm thick can be used as the passivation film. In this case, the hydrogen treatment process may be conducted after forming the silicon oxynitride film. Thus, insulating films having a three-layer structure, in which silicon oxynitride, silicon nitride, and silicon oxynitride are stacked in order from the substrate side, are formed over the TFTs 524 and 525, but the structure or the materials are not limited thereto. Using the above described structure, the TFTs 524 and 525 are covered with the base film 502 and the passivation film, thereby further preventing an alkali metal such as Na or an alkaline earth metal from diffusing into the semiconductor film used in a semiconductor element and from adversely affecting the characteristics of the semiconductor element.

Figure 11D:
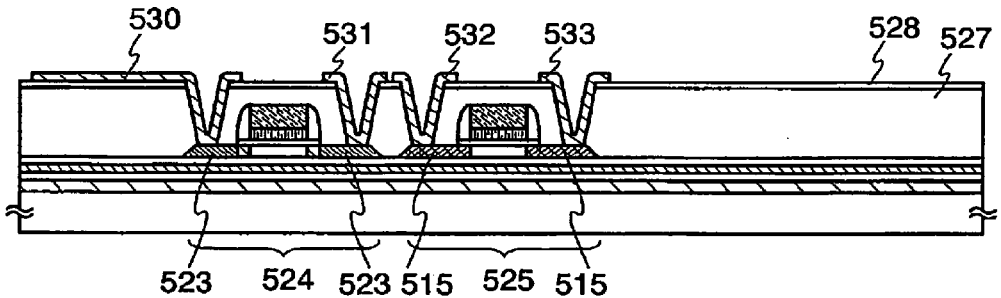
Figure 11E:
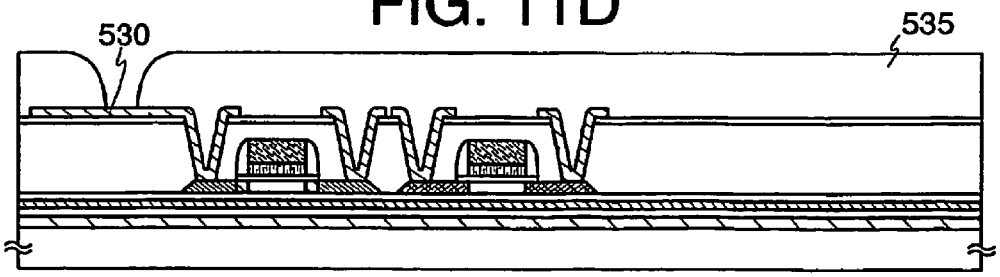

Next, a first interlayer insulating film 527 is formed to cover the TFTs 524 and 525 as shown in FIG. 11D. A heat-resistant organic resin such as polyimide, acrylic, or polyimide can be used for the first interlayer insulating film 527. Other than the organic resin, a low dielectric constant material (low-k material) or a resin containing Si—O—Si bond (hereinafter, referred to as a siloxane resin) or the like can be used. Siloxane has a skeleton structure with a bond of silicon (Si) and oxygen (O). As a substituent thereof, an organic group including at least hydrogen (such as alkyl group or aromatic hydrocarbon) is used. Further, a fluoro group may be used for the substituent. Also, an organic group including at least hydrogen and a fluoro group may be used for the substituent. In forming the first interlayer insulating film 527, a spin coating method, a dipping method, a spray coating method, a droplet discharge method (an ink-jet method, a screen-printing method, an off-set printing method, and the like), a doctor knife, a roll coater, a curtain coater, a knife coater, or the like can be used depending on the material of the interlayer insulating film. Alternatively, an inorganic material may be used. In that case, a silicon oxide film, a silicon nitride film, a silicon oxynitride film, a PSG (phosphorus silicate glass) film, a BPSG (borophosphosilicate glass) film, an alumina film, or the like can be used. Note that these insulating films may be stacked to form the first interlayer insulating film 527.

Further, in this embodiment, a second interlayer insulating film 528 may be formed over the first interlayer insulating film 527. As for the second interlayer insulating film 528, a film containing carbon such as DLC (Diamond Like Carbon) film or a carbon nitride (CN) film, or a silicon oxide film, a silicon nitride film, a silicon nitride oxide film, or the like can be used. As for the forming method, a plasma CVD method, atmospheric pressure plasma, or the like can be used. Alternatively, a photosensitive or nonphotosensitive organic material such as polyimide, acrylic, polyamide, resist, or benzocyclobutene, or a siloxane resin may be used.

Note that a filler may be mixed into at least one of the first interlayer insulating film 527 and the second interlayer insulating film 528 in order to prevent film detachment or a crack in these films due to stress generated by a difference of a thermal expansion coefficient between the first interlayer insulating film 527 or the second interlayer insulating film 528 and a conductive material or the like of a wiring formed in a subsequent step.

As shown in FIG. 11D, contact holes are formed in the first interlayer insulating film 527 and the second interlayer insulating film 528. Wirings 530 to 533 connecting to the TFTs 524 and 525 are formed. As for an etching gas for forming the contact holes, a gas mixture of $CHF_3$ and He is used; however, the present invention is not limited thereto. In this embodiment, the wirings 530 to 533 are formed of Al. In addition, the wirings 530 to 533 may be formed to have a five-layer structure in which Ti, TiN, Al—Si, Ti and TiN are formed in order from the substrate by a sputtering method.

By mixing Si into the Al layer, the generation of hillocks can be prevented during resist baking from wiring patterning. Instead of the Si, Cu of about 0.5 may be mixed. In addition, by sandwiching the Al—Si layer with Ti or TiN, hillock resistance can be enhanced. In patterning, the above-described hard mask of silicon oxynitride or the like is desirably used. Note that the material and the forming method of the wirings are not limited thereto, and the aforementioned materials for forming the gate electrode may be used.

The wirings 530 and 531 are connected to the high concentration impurity regions 523 of the n-channel TFT 524, and the wirings 532 and 533 are connected to the high concentration impurity regions 515 of the p-channel TFT 525.

Next, a third interlayer insulating film 535 is formed on the second interlayer insulating film 528 to cover the wirings 530 to 533 as shown in FIG. 5E. The third interlayer insulating film 535 has an opening through which a part of the wiring 530 is exposed. In addition, the third interlayer insulating film 535 can be formed by using an organic resin film, an inorganic insulating film, or a siloxane film. For example, acryl, polyimide, polyamide, and the like can be used as the organic resin film. Silicon oxide, silicon nitride oxide and the like can be used as the inorganic insulating film. A mask for forming the opening can be formed by a droplet discharge method or a printing method. Alternatively, the third interlayer insulating film 535 itself can be formed by a droplet discharge method or a printing method.

Figure 12A:
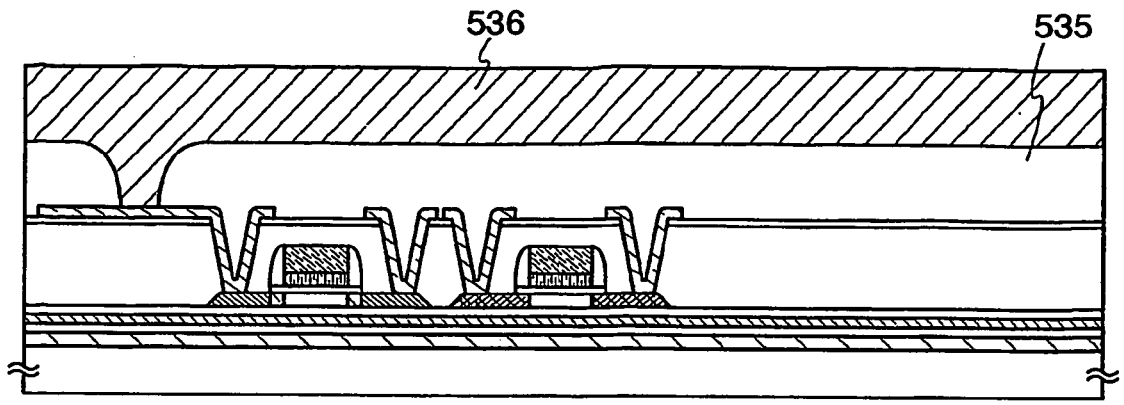
FIGS. 12A to 12C are figures showing a manufacturing method of an ID chip according to the invention.

As shown in FIG. 12A, a protective layer 536 is formed on the third interlayer insulating film 535. The protective layer 536 is made from a material that can protect the third interlayer insulating film 535, the TFTs 524 and 525, and the wirings 530 to 533 in removing the separation layer 501 by etching in a subsequent step. For example, a water-soluble or alcohol-soluble epoxy resin, acrylate resin or silicon resin is wholly applied to form the protective layer 536.

In this embodiment, for forming the protective layer 536, a water-soluble resin (VL-WSHL10 manufactured by Toagosei Co., Ltd., for example) is applied by spin coating to form a film with thickness of 30 μm and exposed to light for 2 minutes so as to be cured temporarily. The water-soluble resin is further exposed to UV light from the backside of the substrate for 2.5 minutes and from the surface thereof for 10 minutes, namely, for 12.5 minutes in total to be cured completely, thereby obtaining the protective layer 536. In the case where plural kinds of organic resins are stacked, the organic resins might be partly dissolved in coating or baking or adhesion thereof might be excessively increased depending on the solvents. Therefore, when the third interlayer insulating film 535 and the protective layer 536 are both made from organic resins that are soluble in the same solvent, an inorganic insulating film (for example, an silicon nitride film, an silicon nitride oxide film, an $AlN_X$ film or an $AlN_XO_Y$ film) is preferably formed to cover the third interlayer insulating film 535 such that the protective layer 536 is smoothly removed in the subsequent step.

Figure 12B:
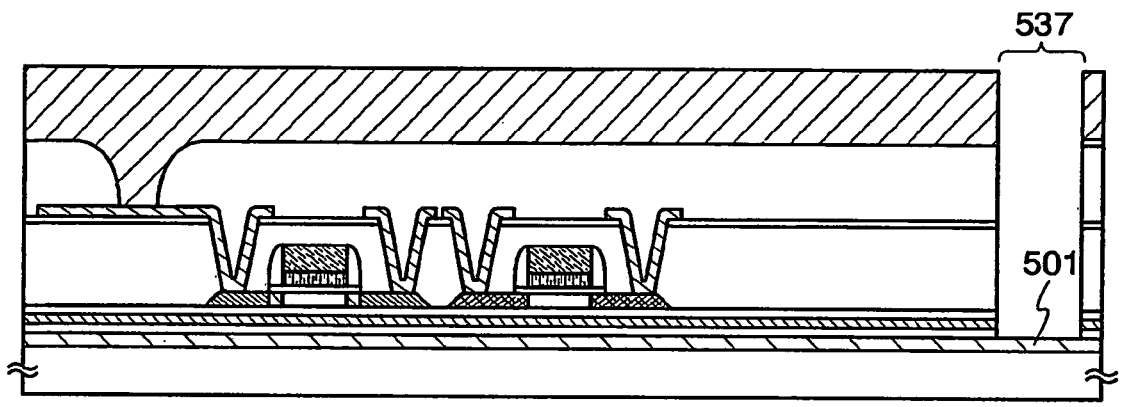

As shown in FIG. 12B, a groove 537 is formed to separate the ID chips from one another. The groove 537 may be deep enough to expose the separation layer 501. The groove 537 can be formed by dicing, scribing, photolithography, or the like. If the ID chips formed over the first substrate 500 are not necessarily to be separated, the groove 537 may not necessarily be formed.

Figure 12C:
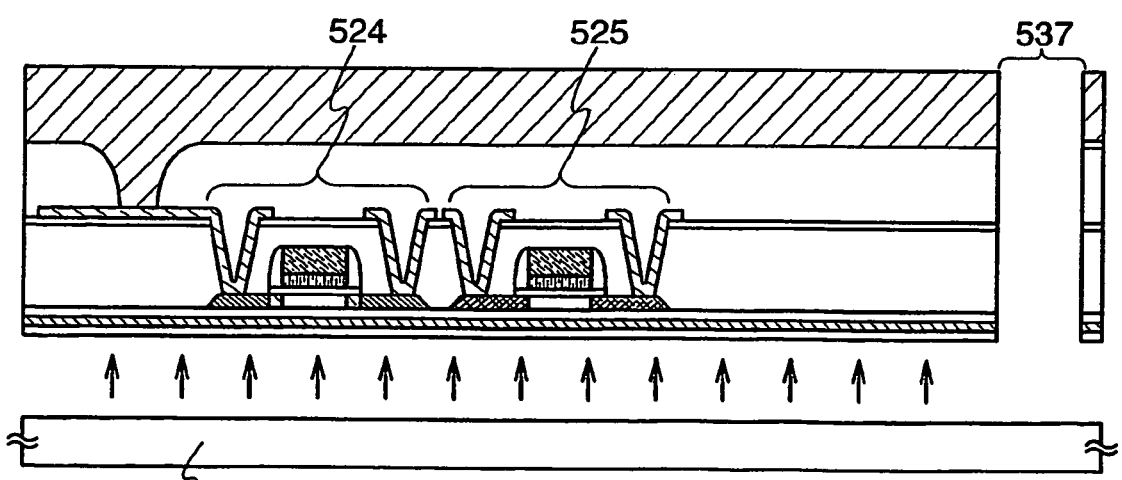

As shown in FIG. 12C, the separation layer 501 is removed by etching. In this embodiment, a halogen fluoride is used as an etching gas and the gas is supplied through the groove 537. In this embodiment, for example, $ClF_3$ (chlorine trifluoride) is used, and etching is carried out under the conditions as follows: a temperature at 350° C.; a flow rate at 300 sccm; and a pressure at $8 \times 10^2$ Pa; for 3 hours. Further, $ClF_3$ gas mixed with nitrogen may be used. By using a halogen fluoride such as $ClF_3$, the separation layer 501 is selectively etched, so that the first substrate 500 can be separated from the TFTs 524 and 525. Note that the halogen fluoride may be in either gas or liquid.

Figure 13A:
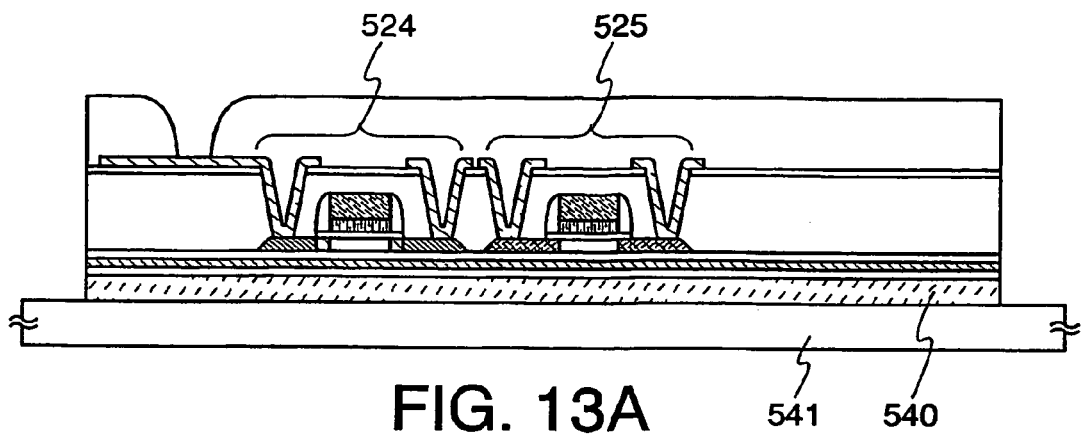
FIGS. 13A to 13C are figures showing a manufacturing method of an ID chip according to the invention.

As shown in FIG. 13A, the separated TFTs 524 and 525 are attached to the second substrate 541 with an adhesive 540. A material that can attach the second substrate 541 to the base film 502 is used for the adhesive 540 and the protective layer 536 are removed. For example, various types of curing adhesives including a reactive curing adhesive, a thermal curing adhesive, a light curable adhesive such as an ultraviolet curable adhesive, an anaerobic curing adhesive, and the like can be used as the adhesive 540. The thickness of the adhesive may preferably be 10 μm to 200 μm.

As for the second substrate 541, a glass substrate such as a barium borosilicate glass substrate or an alumino borosilicate glass substrate, or a flexible organic material such as paper or plastics may be used. In addition, a flexible inorganic material may be used as the second substrate 541. As the plastic substrate, ARTON (manufactured by JSR Corporation) made of polynorbornene with a polar group can be used. Also, the following materials can be used as the plastic substrate: polyester typified by polyethylene terephthalate (PET), polyether sulfone (PES), polyethylene naphthalate (PEN), polycarbonate (PC), nylon, polyether ether ketone (PEEK), polysulfone (PSF), polyetherimide (PEI), polyarylate (PAR), polybutylene terephthalate (PBT), polyimide, acrylonitrile butadiene styrene resin, polyvinyl chloride, polypropylene, polyvinyl acetate, acrylic resin and the like. The second substrate 541 desirably has high thermal conductivity of about 2 to 30 W/mK in order to diffuse the heat generated from the integrated circuit.

In this embodiment, the third interlayer insulating film 535 and the protective layer 536 are formed before the separation step; however, the invention is not limited thereto. Alternatively, the interlayer insulating film 535 is formed after removing the protective layer 536.

Figure 13B:
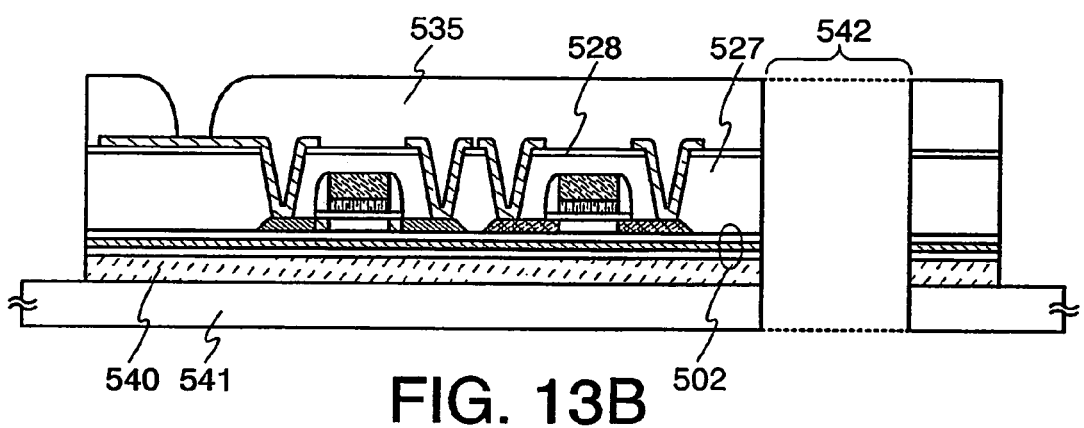

Next, as shown in FIG. 13B, a contact hole 542 is formed in the second substrate 541, the adhesive 540, the base film 502, the first interlayer insulating film 527, the second interlayer insulating film 528, and the third interlayer insulating film 535. The contact hole 542 may be formed by etching or by using a laser. In this embodiment, the contact hole 542 is formed by using a $CO_2$ laser.

Figure 13C:
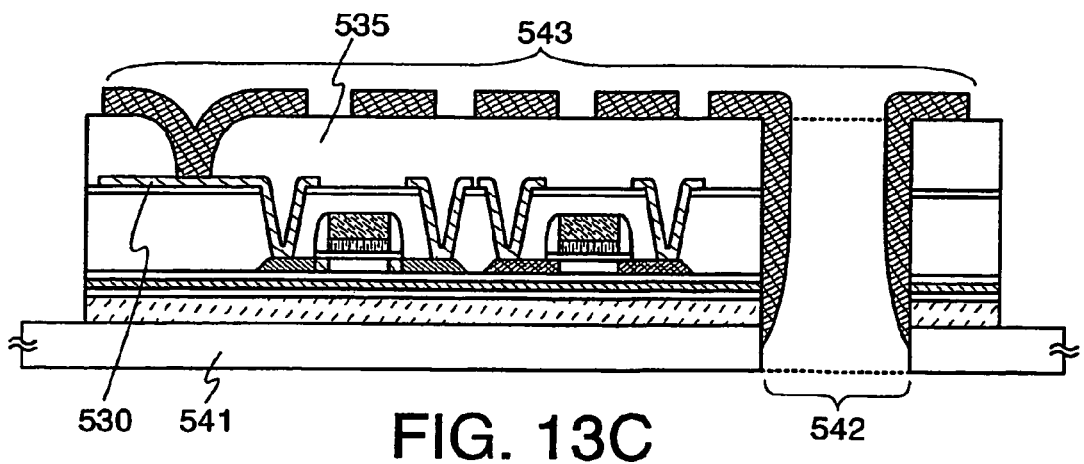

Next, as shown in FIG. 13C, a first conducting wire 543 is formed on third interlayer insulating film 535. The first conducting wire 543 can be formed by a printing method, an electroplating method, a vapor deposition method, or a droplet discharge method. Alternatively, the first conducting wire 543 can be formed by forming a conductive film by a sputtering method or a CVD method, and thereafter patterning it by photolithography. The conducting wire 543 can be formed with the use of a conductive material containing one or more of metals of Ag, Au, Cu, Pd, Cr, Mo, Ti, Ta, W, Al, Fe, Co, Zn, Sn, Ni, and the like or a metal compound thereof.

The first conducting wire 543 is connected to the wiring 530. In FIG. 13C, the first conducting wire 543 is in direct contact with the wiring 530; however, the structure of an ID chip according to a manufacturing method of the invention is not limited to the structure. For example, the first conducting wire 543 and the wiring 530 may be connected electrically by using a wiring which is formed separately. Note that the first conducting wire 543 is formed so that a part thereof reaches the inner side of the contact hole 542.

In this embodiment, the first conducting wire 543 is formed with a single conductive film layer; however, the first conducting wire 543 can be formed with a plurality of conductive film layers.

By using a printing method or a droplet discharge method, the conducting wire 543 can be formed without using a mask for light-exposure. Unlike photolithography in which material loss occurs in etching, the droplet discharge method and the printing method can utilize materials efficiently. In addition, the manufacturing cost of ID chips can be reduced since an expensive mask for light-exposure is not required.

When using a droplet discharge method or one of various printing methods, a conductive particle obtained by coating Cu with Ag can also be used, for example. In the case where the conducting wire 543 is formed by a droplet discharge method, the surface of the third interlayer insulating film 535 is desirably subjected to a treatment for increasing the adhesion of the conducting wire 543.

In order to increase the adhesion, for example, the following methods can be used: a metal or a metal compound that can improve the adhesion of a conductive film or an insulating film due catalysis is attached to the surface of the third interlayer insulating film 535; an organic insulating film, a metal, and a metal compound, each of which has good adhesion to a conductive film or an insulating film to be formed are attached to the surface of the third interlayer insulating film 535; and the surface of the third interlayer insulating film 535 is subjected to plasma treatment under atmospheric pressure or reduced pressure to change the characteristics of the surface thereof. As the metal, which has good adhesion to a conductive film or an insulating film, titanium, titanium oxide, a 3d transition element such as Sc, Ti, V, Cr, Mn, Fe, Co, Ni, Cu, or Zn, or the like can be used. As the metal compound, oxide, nitride, oxynitride and the like of the above-mentioned metals can be used. As the organic insulating film, for example, polyimide, siloxane resin or the like can be used.

When the metal or the metal compound to be attached to the third interlayer insulating film 535 is conductive, the sheet resistance is controlled so as not to hinder the normal operation of the conducting wire 543. Specifically, the average thickness of the conductive metal or the metal compound may be controlled to be, for example, 1 to 10 nm. The metal or the metal compound may be partly or entirely oxidized to be insulated. Alternatively, in a region other than a region in which the adhesion is intended to be improved, the attached metal or metal compound may be selectively removed by etching. The metal or the metal compound may be selectively attached to a certain region by a droplet discharge method, a printing method, a sol-gel method, or the like rather than attached onto the entire surface of the substrate in advance. It is not necessary for the metal or the metal compound to have a completely continuous shape like a film on the surface of the third interlayer insulating film 535 and may be dispersed to some extent.

Figure 14:
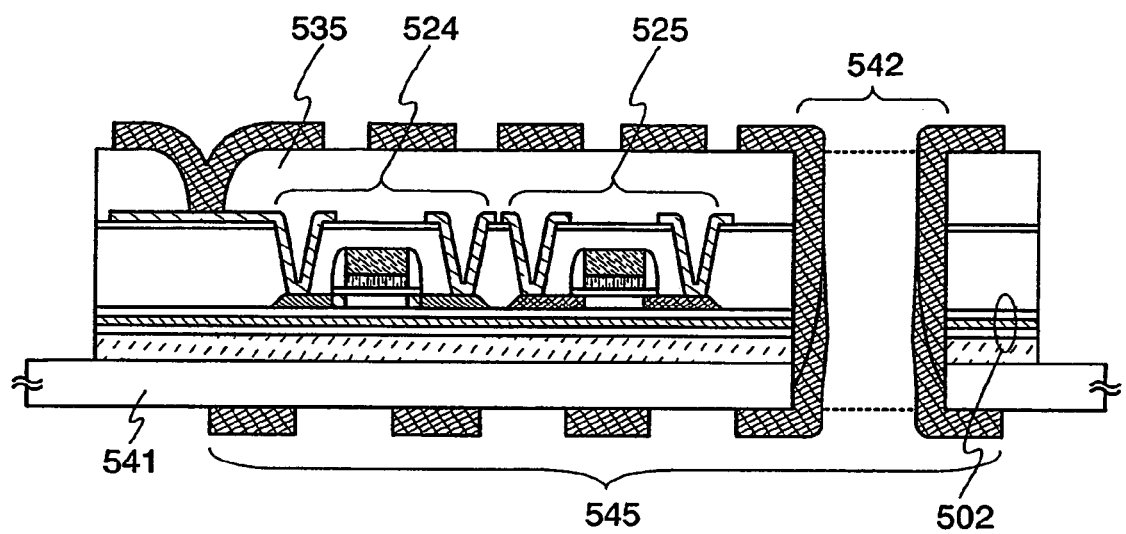
FIG. 14 shows a manufacturing method of an ID chip according to the invention.

Next, as shown in FIG. 14, a second conducting wire 545 is formed on a side of the second substrate 541, opposite to the side where the TFTs 524 and 525 are formed. The second conducting wire 545 can be formed by using the same material and method as the first conducting wire 543. Note that the generation of hillocks can be reduced by adding Si to Al at several wt % instead of using pure Al. However, in the case where heat treatment at a temperature by which a hillock or the like is generated is not performed after the first conducting wire 543 is formed, pure Al instead of Al with Si is preferably used since the resistance can be reduced. Specifically, the resistance of Al with 2 wt % of Si is 3 to 4 μΩcm while the resistance of the pure Al is low as 2 to 3 μΩcm. Further, Al hardly cause pollution alike Cu and the like, and it is low in price. Accordingly, it is preferable to form the first conducting wire 543 or the second conducting wire 545 using pure Al.

The second conducting wire 545 is formed so that a part thereof reaches the inner side of the contact hole 542 and further that the second conducting wire 545 touches a part of the conducting wire 543.

Through the above steps, an ID chip is completed. After the step shown in FIG. 14, the mechanical strength of the ID chip may be improved by using a resin or a cover material as shown in FIGS. 2B to 2E.

By the above manufacturing method, an extremely thin integrated circuit that is 0.3 μm to 3 μm typically, 2 μm in total thickness can be formed. The thickness of the integrated circuit is the thickness between the base film 502 and the third interlayer insulting film 535, including the thickness of the semiconductor element itself. The thickness of the substrate 541 and the first conducting wire 543 and the second conducting wire 545 which serve as antennas is not included in the thickness of the integrated circuit. The area of the integrated circuit in the ID chip can be 5 mm×5 mm (25 mm square) or less, preferably, about 0.3 mm×0.3 mm (0.09 mm square) to 4 mm×4 mm (16 mm square).

In the case where an ID chip is formed so that the integrated circuit formed from the TFTs 524 and 525, the first conducting wire 543 and the second conducting wire 545 are sandwiched by two cover materials; the mechanical strength of the ID chip can be improved by locating the integrated circuit in a position closer to the center between the two cover materials. Specifically, when the distance between the two cover materials is d, it is desirable that the distance x between the center in the thickness direction of the integrated circuit and one of the cover materials can satisfy formula 1 shown below.

$$\frac{1}{2}d - 30 \ \mu m < x < \frac{1}{2}d + 30 \ \mu m$$

Preferably, the formula shown in formula 2 below is satisfied.

$$\frac{1}{2}d - 10 \ \mu m < x < \frac{1}{2}d + 10 \ \mu m$$

Figure 15:
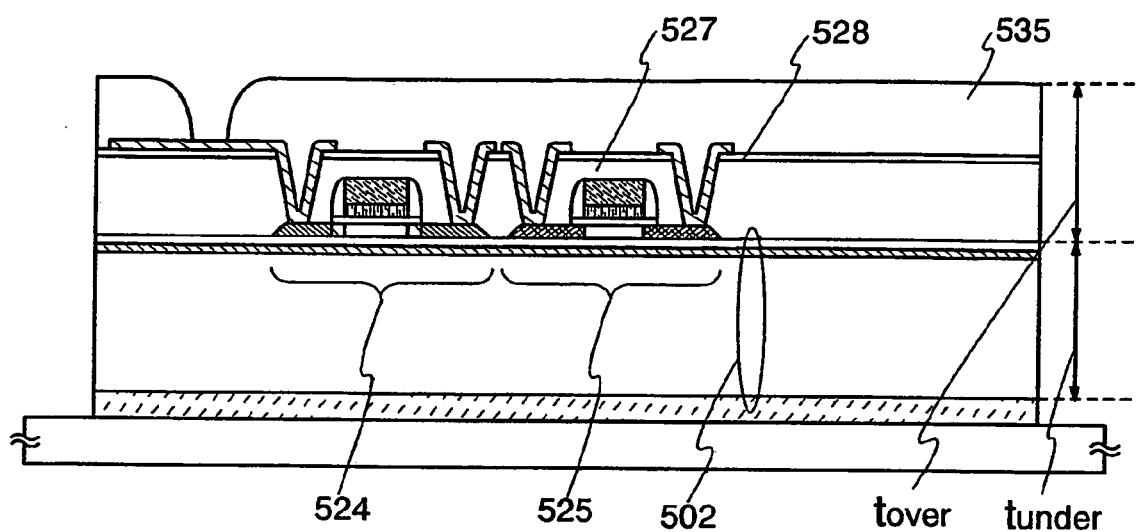
FIG. 15 shows an ID chip according to the invention.

As shown in FIG. 15, the thickness of the base film 502, the first interlayer insulating film 527, the second interlayer insulating film 528, or the third interlayer insulating film 535 may be adjusted so that the distance between the island-like semiconductor film used for the TFTs 524 and 525 and the bottom of the base film ($t_{under}$) is equal or almost equal to the distance between the island-like semiconductor film of the TFTs 524 and 525 and the top of the third interlayer insulating film 535 ($t_{over}$). FIG. 15 shows a cross-sectional view of the ID chip before forming the contact hole 542, the first conducting wire 543, and the second conducting wire 545 in order to clarify the thicknesses of which part is shown by $t_{under}$ and $t_{over}$. By locating the island-like semiconductor film in the center of the integrated circuit, the stress applied on the semiconductor layer can be alleviated and generation of cracks can be prevented.

In the case where an organic resin is used as the adhesive 540 in contact with the base film 502, to ensure the flexibility of the ID chip, an alkaline metal such as Na or an alkaline earth metal can be prevented from spreading into the semiconductor film from the organic resin by using a silicon nitride film or a silicon nitride oxide film as the base film 502.

When an ID chip is attached to an object having a curved surface, it is preferable that the direction of the curve is perpendicular to a direction of carrier movement in the TFTs 524 and 525. According to the structure, adverse affects due to bending of the second substrate 541 to the characteristics of the TFTs 524 and 525 can be prevented. The percentage of area in the integrated circuit occupied by the island-like semiconductor films is set 1 to 30%, thereby suppressing adverse affects to the characteristics of the TFTs 524 and 525 even when the second substrate 541 is bent.

In general, ID chips mostly use radio waves with a frequency of 13.56 MHz or 2.45 GHz. Therefore, it is extremely important for expanding the versatility of the ID chips that the ID chip is formed so as to detect radio waves of these frequencies.

The ID chip of this embodiment has the advantage that radio waves are less shielded as compared with in an ID chip formed by using a semiconductor substrate, and thus signal attenuation due to shielded radio waves can be prevented. Therefore, since a semiconductor substrate is not needed, the cost of the ID chip can be drastically reduced. For example, the case of using a semiconductor substrate with a diameter of 12 inches is compared with the case of using a glass substrate with a size of 730×920 mm². The silicon substrate has an area of about 73000 mm² whereas the glass substrate has an area of about 672000 mm², that is, the glass substrate is about 9.2 times larger than the semiconductor substrate. On the glass substrate with an area of about 672000 mm², about 672000 ID chips each having an area of 1 mm square can be formed when margin for cutting the substrate is not taken into account, which is about 9.2 times comparing the number of the ID chips formed on the semiconductor substrate. In the case of using the glass substrate with a size of 730×920 mm², which requires fewer manufacturing steps necessary for manufacturing the same number of ID chips, facility investment cost for mass production of ID chips can be reduced by one-third of the case in which the silicon substrate with a diameter of 12 inches is used. Further, according to the present invention, after an integrated circuit is separated from a glass substrate, the glass substrate can be reused. Therefore, in the case of using the glass substrate, the cost can be significantly reduced when compared to the case of using the semiconductor substrate, even considering the cost of compensating for a broken glass substrate or cleaning a surface of the glass substrate. Even if a glass substrate is not reused and discarded, a glass substrate with a size of 730×920 mm$^2$ costs about half as much as a silicon substrate with a diameter of 12 inches. As a result, it is apparent that the cost of an ID chip can be reduced drastically.

Thus, an ID chip using a glass substrate with a size of 730×920 mm$^2$ costs about only one-thirtieth as much as an ID chip using a semiconductor substrate with a diameter of 12 inches. Since the ID chip is expected to be used as a disposable one, the ID chip manufactured according the present invention, which can cost much less, is quite effective for such an application.

Embodiment 2

In this embodiment, a method for manufacturing plural ID chips with the use of a large substrate will be described.

Figure 16A:
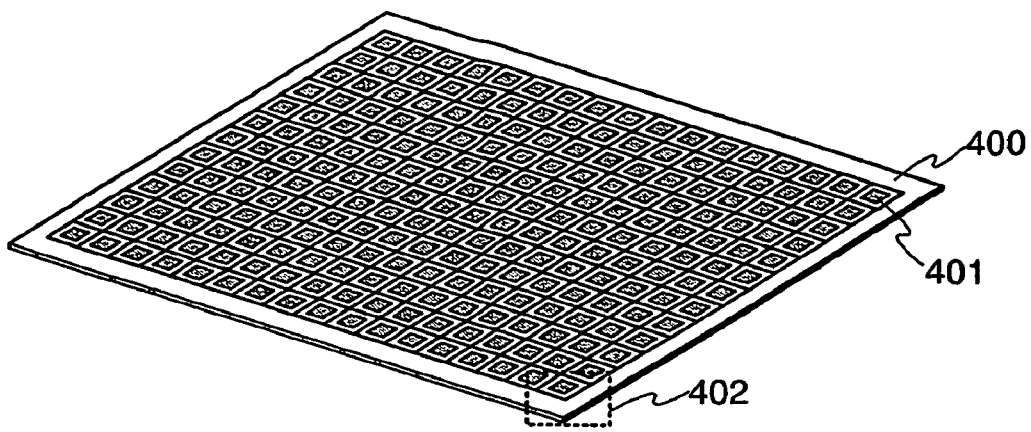
FIGS. 16A to 16C are figures showing a method for manufacturing plural ID chips of the invention with the use of a large substrate.
Figure 16B:
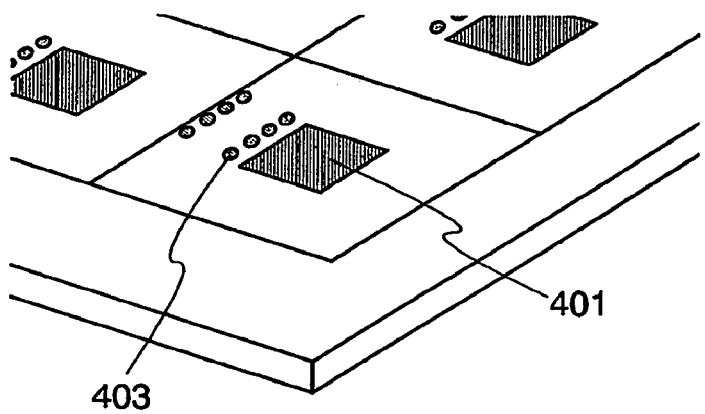

A plurality of integrated circuits 401 are formed over a substrate 400. Thereafter, a contact hole 403 for connecting a first conducting wire 404 and a second conducting wire 405 to be formed later is formed. FIG. 16A shows a state where the plurality of integrated circuits 401 corresponding to each ID chip are formed over the substrate 400. FIG. 16B shows an enlarged view of an area enclosed by dashed lines 402 of FIG. 16A.

Figure 16C:
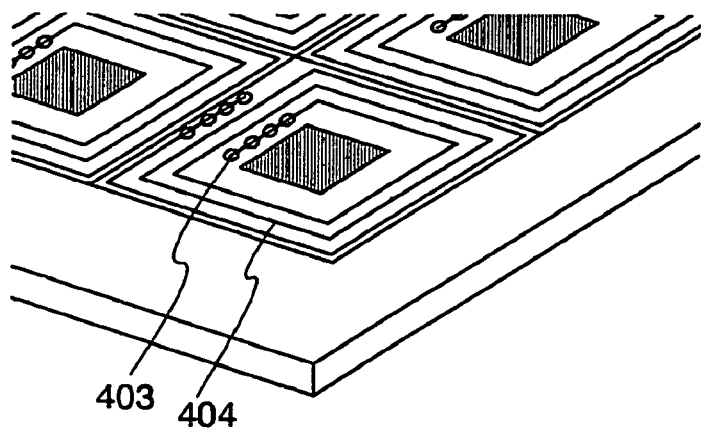

Next, a first conducting wire 404 is formed on a side where the integrated circuits 401 are formed, and a second conducting wire is formed on a side opposite to the side where the integrated circuits 401 are formed. FIG. 16C shows an enlarged view of an area enclosed by dashed lines 402 in FIG. 16A after forming the first conducting wire 404. As shown in FIG. 16C, the first conducting wire 404 is formed so as to overlap with the contact hole 403. Thus, the first conducting wire 404 can be connected to the second conducting wire in the contact hole 403.

After forming the conducting wire 404 and the second conducting wire, the integrated circuits 401, the first conducting wire 404, and the second conducting wire are separated by dicing, scribing, or the like. The mechanical strength of the ID chip can be improved by a resin or a cover material before separating the ID chip. Alternatively, the mechanical strength of the ID chip can be improved by a resin or a cover material after separating the ID chip.

Note that the ID chip using a glass substrate can be referred to as an IDG chip (identification glass chip) whereas the ID chip using a flexible substrate can be referred to as an IDF chip (identification flexible ship).

This embodiment can be combined with Embodiment 1.

Embodiment 3

In this embodiment, structures of TFTs used in ID chips of the present invention will be described.

Figure 17A:
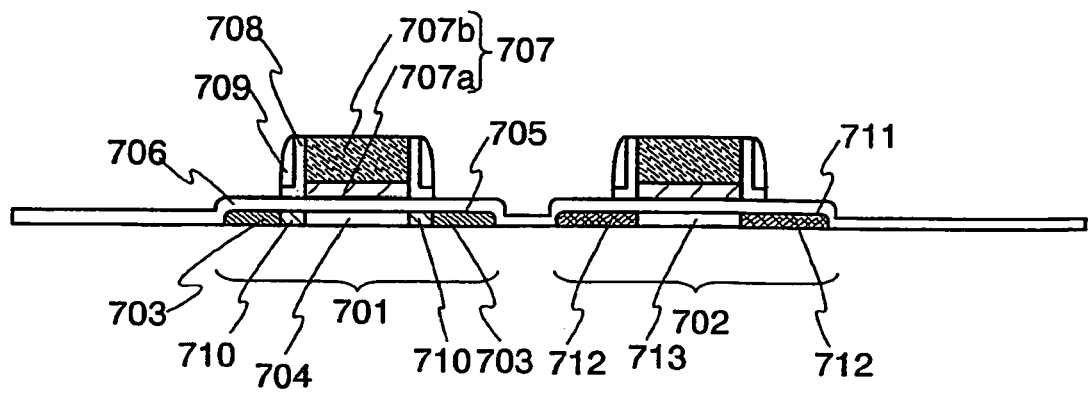
FIGS. 17A to 17C are cross-sectional views of a TFT in an ID chip of the invention.

FIG. 17A shows a cross sectional view of TFT according to the embodiment. Reference numeral 701 represents an n-channel TFT; and 702, a p-channel TFT. The configuration of the n-channel TFT 701 will be explained in detail as an example.

The n-channel TFT 701 includes an island-like semiconductor film 705 used as an active layer. The island-like semiconductor film 705 includes two impurity regions 703 used as a source region and a drain region, a channel forming region 704 sandwiched between the two impurity regions 703, and two LDD (lightly doped drain) regions 710 sandwiched between the impurity regions 703 and the channel forming region 704. The n-channel TFT 701 further includes a gate insulating film 706 covering the island-like semiconductor film 705, a gate electrode 707, and two sidewalls 708 and 709 made from insulating films.

Although the gate electrode 707 includes two conductive films 707a and 707b in this embodiment, the present invention is not limited to this configuration. The gate electrode 707 may formed of a single-layer conductive film or two or more layer conductive films. The gate electrode 707 overlaps the channel forming region 704 of the island-like semiconductor film 705 with the gate insulating film 706 therebetween. The sidewalls 708 and 709 overlap the two LDD regions 710 of the island-like semiconductor film 705 with the gate insulating layer 706 therebetween.

For example, the sidewalls 708 can be formed by etching a silicon oxide film with a thickness of 100 nm whereas the sidewalls 709 can be formed by etching an LTO film (a low temperature oxide film) with a thickness of 200 nm. In this embodiment, the silicon oxide film used for the sidewalls 708 is formed by a plasma CVD method and the LTO film used for the sidewalls 709 is formed by a low pressure CVD method. Note that although the silicon oxide film may contain nitrogen, the number of nitrogen atoms is to be set lower than that of oxygen atoms.

After doping an n-type impurity to the island-like semiconductor film 705 using the gate electrode 707 as a mask, the sidewalls 708 and 709 are formed, and an n-type impurity element is doped to the island-like semiconductor film 705 utilizing the sidewalls 708 and 709 as masks, so that the impurity regions 703 and the LDD regions 710 can be formed separately.

The p-channel TFT 702 has almost the same configuration as the n-channel TFT 701; however, only a structure of an island-like semiconductor film 711 of the p-channel TFT 702 is different. The island-like semiconductor film 711 does not have an LDD region, but includes two impurity regions 712 and a channel forming region 713 sandwiched between the impurity regions 712. The impurity regions 712 are doped with a p-type impurity. Although FIG. 17A illustrates an example in which the p-channel TFT 702 does not have an LDD region, the present invention is not limited to this configuration. The p-channel TFT 702 may include an LDD region.

Figure 17B:
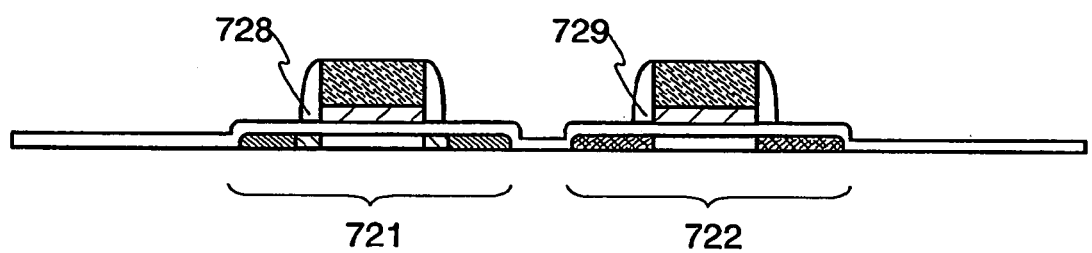

FIG. 17B shows a case where each TFT shown in FIG. 17A has sidewalls each formed of one layer. An n-channel TFT 721 and a p-channel TFT 722 as shown in FIG. 17B each include the pairs of sidewalls 728 and 729, respectively. The sidewalls 728 and 729 can, for example, be made by etching a silicon oxide film with a thickness of 100 nm. In this embodiment, the silicon oxide film used for the sidewall 728 and 729 are formed by a plasma CVD method. The silicon oxide film may contain nitrogen; however, the number of nitrogen atoms is to be set lower than that of oxygen atoms.

Figure 17C:
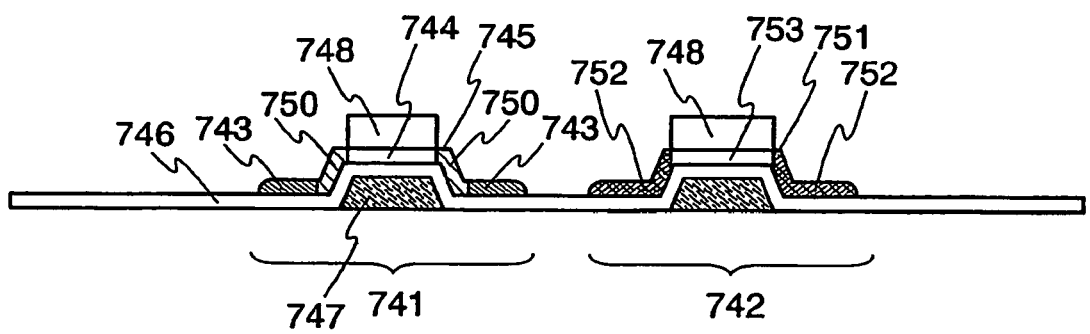

FIG. 17C shows a structure of bottom-gate TFTs. Reference numeral 741 denotes an n-channel TFT; and 742, a p-channel TFT. The n-channel TFT 741 will be explained in detail as an example.

In FIG. 17C, the n-channel TFT 741 includes an island-like semiconductor film 745. The island-like semiconductor film 745 includes two impurity regions 743 used as a source region and a drain region, a channel forming region 744 sandwiched between the impurity regions 743, and two LDD (lightly doped drain) regions 750 sandwiched between the two impurity regions 743 and the channel forming region 744. The n-channel TFT 741 further includes a gate insulating film 746, a gate electrode 747 and a protective film 748 which is made from an insulating film.

The gate electrode 747 overlaps the channel forming region 744 of the island-like semiconductor film 745 with the gate insulating film 746 therebetween. The gate insulating film 746 is formed after forming the gate electrode 747 and the island-like semiconductor film 745 is formed after forming the gate insulating film 746. The protective film 748 overlaps the gate insulating film 746 with the channel forming region 744 therebetween.

The channel protective film 748, for example, can be formed by etching a silicon oxide film with a thickness of 100 nm. In this embodiment, the silicon oxide film is formed by a plasma CVD method as the channel protective film 748. Note that the silicon oxide film may contain nitrogen; however, the number of nitrogen atoms is to be set lower than that of oxygen atoms.

After doping an n-type impurity to the island-like semiconductor film 745 utilizing a mask made from a resist, the channel protective film 748 is formed, and an n-type impurity is doped to the island-like semiconductor film 745 by utilizing the channel protective film 748 as a mask, so that the impurity regions 743 and the LDD regions 750 can be formed separately.

Although the p-channel TFT 742 has almost the same structure as the n-channel TFT 741, only the structure of the island-like semiconductor film 751 of the p-channel TFT 742 is different. The island-like semiconductor film 751 does not include an LDD region, but includes two impurity regions 752 and a channel forming region 753 sandwiched between the two impurity regions 752. The impurity regions 752 are doped with a p-type impurity. Although FIG. 17C shows the example in which the p-channel TFT 742 does not have an LDD region, the present invention is not limited to the structure. The p-channel TFT 742 may include an LDD region. In addition, the n-channel TFT 741 does not necessarily include an LDD region.

Embodiment 4

When a semiconductor device such as an ID chip of the present invention is formed using a flexible substrate, the ID chip is suitable for being attached to an object having flexibility or a curved face. When a memory such as a ROM that cannot be rewritten is formed inside of an integrated circuit included in the ID chip of the present invention, forgery of the objects attached with the ID chip can be prevented. For example, the application of the ID chip of the present invention to foods, which their commodity values largely depend on production areas and producers, is advantageous for inhibiting mislabeling of the production areas and producers at a low cost.

Specifically, the ID chip of the present invention can be used as the ID chip attached to tags having information about objects such as luggage tags, price tags and name tags. Also, the ID chip of the present invention itself may be utilized such as tags. For example, the ID chip may be attached to certificates corresponding to documents that prove facts such as family registers, certificates of residence, passports, licenses, identification cards, member cards, surveyor certificates, credit cards, cash cards, prepaid cards, consultation cards and commuter passes. In addition, for instance, the ID chip may be attached to portfolios corresponding to certificates that show property rights in private law such as bills, checks, carriage notes, cargo certificates, warehouse certificates, stock certificates, bond certificates, gift certificates and deeds of mortgage.

Figure 18A:
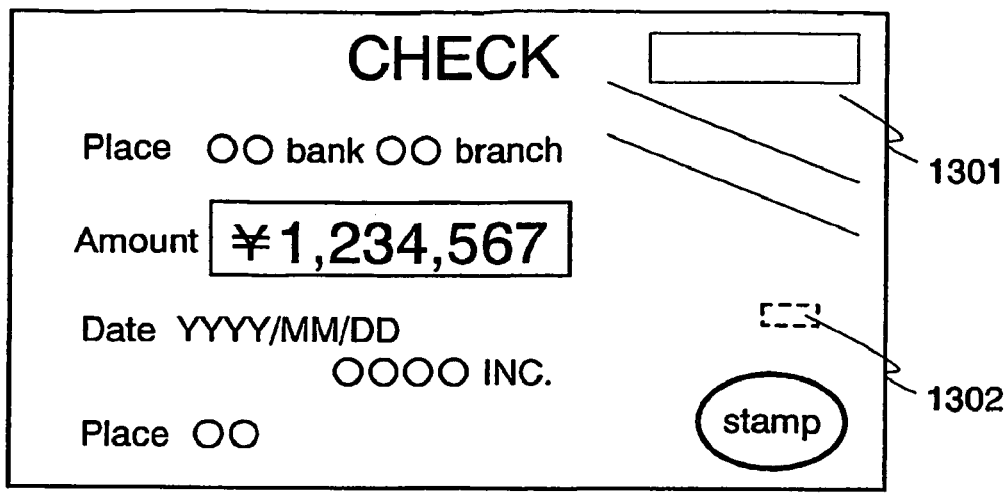
FIGS. 18A to 18C are figures showing the usage of an ID chip of the invention.

FIG. 18A shows an example of a check 1301 attached with an ID chip 1302 of the present invention. Although the ID chip 1302 is attached to the inside of the check 1301 in FIG. 18A, it may be provided to be exposed on the surface of the check. An ID chip of the present invention in the case of using a flexible substrate has an advantageous effect that the ID chip is not broken by stress if it is attached to the flexible check 1301.

Figure 18B:
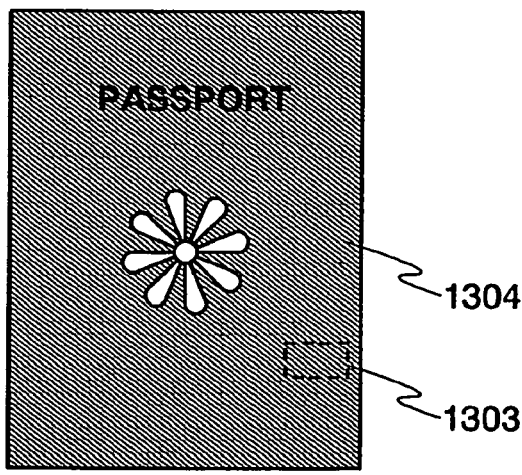

FIG. 18B shows an example of a passport 1304 attached with an ID chip 1303 of the present invention. Although the ID chip 1303 is attached to the front page of the passport 1304 in FIG. 18B, it may be attached to another page of the passport. An ID chip of the present invention in the case of using a flexible substrate has an advantageous effect that the ID chip is not broken by stress if it is attached to the flexible passport 1304.

Figure 18C:

FIG. 18C shows an example of a gift certificate 1306 attached with an ID chip 1305 of the present invention. The ID chip 1305 may be attached to either the inside of the gift certificate 1306 or on the surface thereof to be exposed. An ID chip of the present invention in the case of using a flexible substrate has an advantageous effect that the ID chip is not broken by stress if it is attached to the flexible gift certificate 1306.

The ID chip using an integrated circuit with TFTs is inexpensive and thin, and hence, the ID chip of the present invention is suitable for ID chips that are eventually discarded by consumers. In particular, when the ID chip is applied to products in which difference in price in units of several yen to several tens of yen significantly affects sales, a packing material having the inexpensive and thin ID chip of the present invention is very advantageous. The packing material is equivalent to a support medium, such as a plastic wrap, a plastic bottle, a tray and a capsule, which can be shaped or has been shaped to wrap up an object.

Figure 19A:
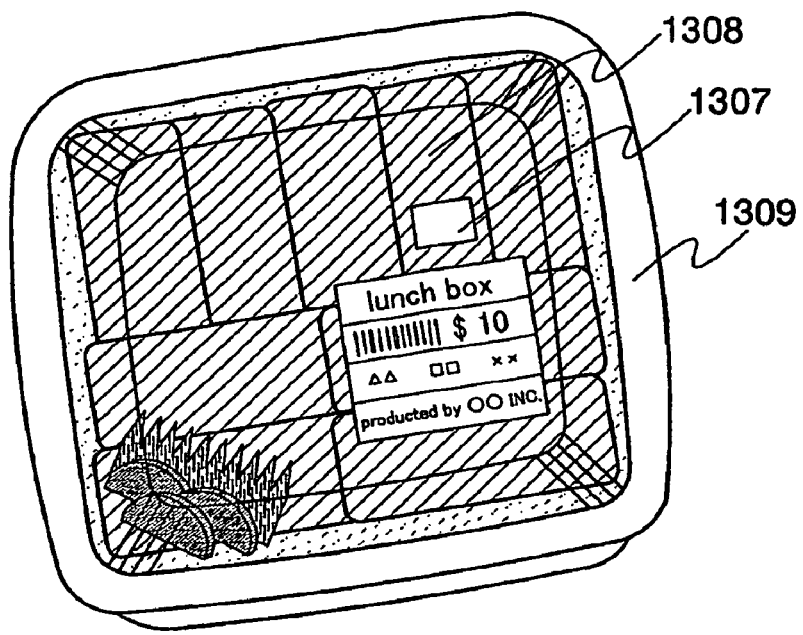
FIGS. 19A to 19B are figures showing the usage of an ID chip of the invention.

A state of packing a boxed meal 1309 for sale by a packing material 1308, which is attached with an ID chip 1307 of the present invention, is shown in FIG. 19A. By storing the price and the like of the product in the ID chip 1307, the price for the boxed meal 1309 can be accounted for by a register having functions of a reader/writer. Further, management of inventory or expiration dates of products can be easily done.

For example, the ID chips of the present invention may be attached to a product label so that the distribution process of the product is managed.

Figure 19B:
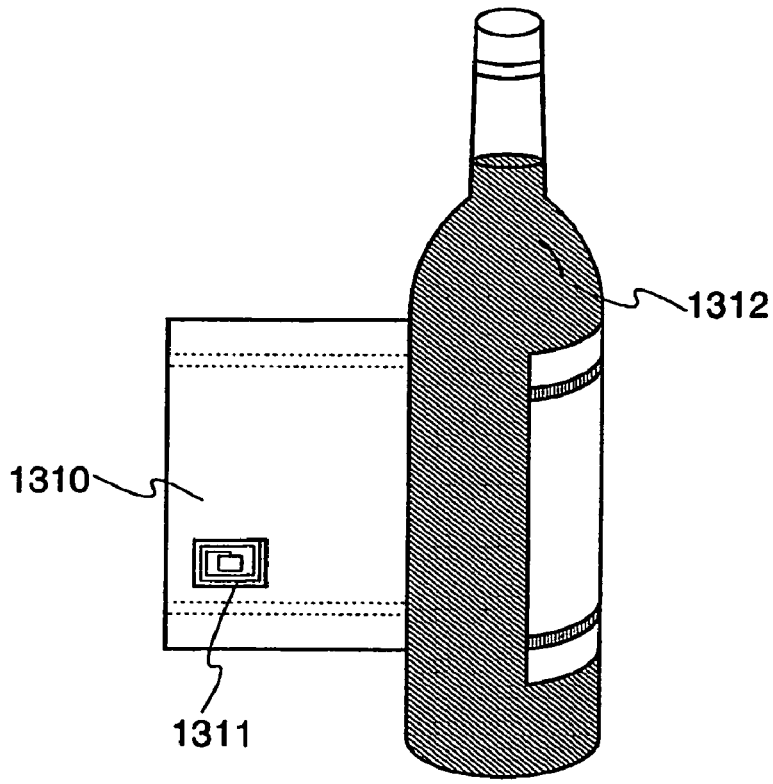

As shown in FIG. 19B, an ID chip 1311 of the present invention is attached to a support medium such as a product label 1310 with its rear face having viscosity. The label 1310 attached with the ID chip 1311 is pasted to a product 1312. Identification information about the product 1312 can be read wirelessly from the ID chip 1311 attached to the label 1310. Accordingly, management of the distribution process of the product becomes easier by the ID chip 1311. An ID chip of the present invention in the case of using a glass substrate has an advantageous effect that the ID chip is not broken by stress if it is attached to the flexible label 1310. Therefore, the label 1310 using the ID chip of the present invention is suitable for being attached onto an object having a curved surface.

In the case of using a nonvolatile memory, which can write information therein, as a memory of an integrated circuit included in the ID chip 1311, information of the distribution process of the product 1312 can be stored. Stored information of the process in the production stage of products can allow wholesalers, retailers and consumers to grasp information about production areas, producers, date of manufacture, processing methods, and the like easily.

This embodiment can be freely combined with any one of Embodiment 1 to Embodiments 3.

Embodiment 5

In this embodiment, a method for covering an ID chip according to the invention by using a roll to roll process will be described.

FIG. 20A shows a state where an ID chip is covered with a cover material by using a roll-to-roll process. In FIG. 20A, a reel 2001 is wound by a first cover material 2003. The reel 2001 and a reel 2002 are rotated in synchronization. Thus, the first cover material 2003 is dispensed from the reel 2001, and the dispensed first cover material 2003 can be successively wound by the reel 2002.

When the first cover material 2003 moves from the reel 2001 to the reel 2002, a resin 2005 is first applied to the first cover material 2003 with the use of a coating applicator 2004. The resin 2005 may be applied by being dropped, and it may be applied by being sprayed. Next, ID chips 2006 are sequentially placed on the resin 2005, and the ID chip 2006s are fixed on the first cover material 2003.

Next, a resin 2008 is applied over the first cover material 2003 so as to cover the ID chips 2006 by using a coating applicator 2007. The resin 2008 may be applied by being dropped, and it may be applied by being sprayed like the resin 2005. Further, at least the ID chips 2006 are required to be coated with the resin 2008, and the resin is not necessarily required to be applied onto the cover material 2003.

Next, a second cover material 2009 is attached on the resin 2008. The second cover material 2009 is wound by a reel 2010. The second cover material 2009 is dispensed wound by the reel 2010 and the second cover material 2009 is dispensed from the reel 2010 by rotating the reels 2010 and the reel 2002 in synchronization, and the dispensed cover material 2009 can be successively wound by the reel 2002 with the first cover material 2003. In FIG. 20A, the alignment of the second cover material 2009 dispensed from the reel 2010 and the ID chips 2006 is controlled by using a reel 2011; however, the reel 2011 is not necessarily be used. Further, pressure is applied to the second cover material 2009 by the pressure device 2012 so that the second cover material 2009 is attached onto the resin 2008.

Next, the first cover material 2003 and the second cover material 2009 are dotted with holes like a tear line by using a perforating device 2013, thereby making the ID chips 2006 easier to be separated from each other. FIG. 20B shows a top view of the second cover material 2009 provided with a tear line 2014. The tear line 2014 is to be formed in an area other than the areas provided with the ID chips 2006. In FIG. 20B, the ID chips 2006 are arranged in a line in a moving direction; however, this embodiment is not limited to this structure. As shown in FIG. 20C, the ID chips 2006 may be arranged to form a plurality of lines in the moving direction.

The ID chips 2006 after the above steps are wound by reel 2002 with the first cover material 2003 and the second cover material 2009.

As in this embodiment, the ID chips can be transferred in a state where the ID chips are wound by the reel 2002 by winding the ID chip around the reel 2002. Thus, the efficiency of transferring the ID chips 2006 can be improved.

100: an integrated circuit, 101: a conducting wire, 102: a conducting wire, 103: a substrate, 104: a TFT (thin film transistor), 105: an interlayer insulating film, 106: layers, 107: a contact hole, 201: a conducting wire, 202: a conducting wire, 203: an integrated circuit, 204: a cover material, 204a, a cover material, 205: a resin, 301: a substrate, 302: a semiconductor element, 303: an interlayer insulating film, 304: a wiring, 305: layers, 306: a contact hole, 307: a conducting wire, 308: a conducting wire, 311: a substrate, 312: a separation layer, 313: a base film, 314: a semiconductor element, 315: an interlayer insulating film, 316: a wiring, 317: an adhesive, 318: layers, 319: a contact hole, 320: a conducting wire, 321: a conducting wire, 322: a substrate, 331: a substrate, 332: a separation layer, 333: a base film, 334: a semiconductor element, 335: an interlayer insulating film, 336: a wiring, 340: a conducting wire, 341: a conducting wire, 351: a wiring, 352: a wiring, 353: a resin, 354: a cover material, 400: a substrate, 401: an integrated circuit, 402: dashed lines, 403: a contact hole, 404: a conducting wire, 500: a substrate, 501: a separation layer, 502: a base film, 503: a semiconductor film, 504: a semiconductor film, 505: a semiconductor film, 506: a gate insulating film, 507: a gate electrode, 508: a gate electrode, 510: a resist, 511: a resist, 512: a low concentration impurity region, 514: a resist, 515: a high concentration impurity region, 517: an insulating film, 519: a sidewall, 522: a resist, 523: a high concentration impurity region, 524: an n-channel TFT, 525: a p-channel TFT, 527: an interlayer insulating film, 528: an interlayer insulating film, 530: a wiring, 532: a wiring, 535: an interlayer insulating film, 536: a protective layer, 537: a groove, 540: an adhesive, 541: a substrate, 542: a contact hole, 543: a conducting wire, 545: a conducting wire, 601: a conducting wire, 602: a conducting wire, 603: an integrated circuit, 605: an antenna, 606: a rectifier circuit, 607: a demodulation circuit, 608: a modulation circuit, 609: a microprocessor, 610: a memory, 611: a conducting wire, 612: a conducting wire, 613: an integrated circuit, 616: a rectifier circuit, 617: a demodulation circuit, 618: a modulation circuit, 619: a microprocessor, 620: a memory, 621: an antenna, 622: an antenna, 701: an n-channel TFT, 702: a p-channel TFT, 703: an impurity region, 704: a channel forming region, 705: a semiconductor film, 706: a gate insulating film, 707: a gate electrode, 707a, a conductive film, 708: a sidewall, 709: a sidewall, 710: an LDD (Lightly Doped Drain) region, 711: a semiconductor film, 712: an impurity region, 713: a channel forming region, 721: an n-channel TFT, 722: a p-channel TFT, 728: a sidewall, 741: n-channel TFT, 742: a p-channel TFT, 743, an impurity region, 744, a channel forming region, 745, a semiconductor film, 746, a gate insulating film, 747, a gate electrode, 748: a channel protective film, 750: an LDD (Lightly Doped Drain) region, 751: a semiconductor film, 752: an impurity region, 753: a channel forming region, 1301: a check, 1302: an ID chip, 1303: an ID chip, 1304: a passport, 1305: an ID chip, 1306: a gift certificate, 1307: an ID chip, 1308: a packing material, 1309: a boxed meal, 1310: a label, 1311: an ID chip, 1312: a product, 2001: a reel, 2002: a reel, 2003: a cover material, 2004: a coating applicator, 2005: a resin, 2006: an ID chip, 2007: a coating applicator, 2008: a resin, 2009: a cover material, 2010: a reel, 2011: a reel, 2012: a pressure device, 2013: a perforating device, 2014 a tear line.

The invention claimed is:

1. A semiconductor device comprising:
   an antenna including a first conducting wire and a second conducting wire; and
   a circuit including a transistor;
   wherein one of a source region and a drain region of the transistor is electrically connected to the first conducting wire,
   wherein the circuit is provided between the first conducting wire and the second conducting wire, and wherein the first conducting wire, the second conducting wire and the integrated circuit are covered with a resin.

2. A semiconductor device comprising:
an antenna including a first conducting wire and a second conducting wire; and
a circuit including at least one interlayer insulating film over a substrate;
wherein the substrate is provided between the first conducting wire and the second conducting wire, and
wherein the first conducting wire and the second conducting wire are connected in a contact hole formed in the substrate and layers including the interlayer insulating film.

3. The semiconductor device according to claim 2,
wherein the substrate is a flexible substrate.

4. A semiconductor device comprising:
an antenna including a first conductive film and a second conductive film; and
a circuit including a transistor,
wherein one of a source region and a drain region of the transistor is electrically connected to the first conductive film,
wherein the circuit is provided between the first conductive film and the second conductive film, and
wherein the first conductive film, the second conductive film and the integrated circuit are covered with a resin.

5. A semiconductor device comprising:
an antenna including a first conductive film and a second conductive film; and
a circuit including at least one interlayer insulating film over a substrate,
wherein the substrate is provided between the first conductive film and the second conductive film, and
wherein the first conductive film and the second conductive film are connected in a contact hole formed in the substrate and layers including the interlayer insulating film.

6. The semiconductor device according to claim 5,
wherein the substrate is a flexible substrate.

7. A semiconductor device comprising:
a circuit having a thin film transistor;
an insulating film over the circuit;
a first conducting wire functioning as a first antenna electrically connecting to the circuit through a contact hole in the insulating film;
a second conducting wire functioning as a second antenna, and
wherein the first conducting wire, the second conducting wire and the integrated circuit are covered with a resin.

8. The semiconductor device according to any one of claims 1 though 7,
wherein the circuit includes a rectification circuit, a demodulation circuit, and a modulation circuit.

9. The semiconductor device according to claim 7,
wherein the first conducting wire and the second conducting wire are electrically connected.

10. The semiconductor device according to claim 7,
wherein the first conducting wire and the second conducting wire are electrically isolated from each other.

11. The semiconductor device according to claim 7,
wherein the first antenna is configured to transmit and receive signals, and
wherein the second antenna is configured to apply power to the circuit.

12. The semiconductor device according to claim 7,
wherein the first antenna is configured to transmit signals, and
wherein the second antenna is configured to receive the signals and to apply power to the circuit.

13. A semiconductor device comprising:
a first antenna including a first conducting wire;
a second antenna including a second conducting wire; and
a circuit including a transistor,
wherein one of a source region and a drain region of the transistor is electrically connected to the first conducting wire,
wherein the circuit is provided between the first conducting wire and the second conducting wire, and
wherein the first antenna, the second antenna and the circuit are covered with a resin.

14. The semiconductor device according to claim 13,
wherein the first antenna is configured to transmit and receive signals, and
wherein the second antenna is configured to apply power to the circuit.

15. The semiconductor device according to claim 13,
wherein the first antenna is configured to transmit signals, and
wherein the second antenna is configured to receive the signals and to apply power to the circuit.

16. A semiconductor device comprising:
a first antenna including a first conducting wire;
a second antenna including a second conducting wire; and
a circuit over a substrate,
wherein the substrate and the circuit are provided between the first conducting wire and the second conducting wire,
wherein the first conducting wire and the second conducting wire are electrically isolated from each other,
wherein the first conducting wire is connected to the circuit,
wherein the second conducting wire is connected to the circuit in a contact hole formed in the substrate, and
wherein the first antenna, the second antenna and the circuit are covered with a resin.

17. The semiconductor device according to claim 16,
wherein the substrate is a flexible substrate.

18. The semiconductor device according to claim 16,
wherein the first antenna is configured to transmit and receive signals, and
wherein the second antenna is configured to apply power to the circuit.

19. The semiconductor device according to claim 16,
wherein the first antenna is configured to transmit signals, and
wherein the second antenna is configured to receive the signals and to apply power to the circuit.

20. A semiconductor device comprising:
a first antenna including a first conductive film;
a second antenna including a second conductive film; and
a circuit including a transistor;
wherein one of a source region and a drain region of the transistor is electrically connected to the first conductive film,
wherein the circuit is provided between the first conductive film and the second conductive film, and
wherein the first antenna, the second antenna and the circuit are covered with a resin.

21. The semiconductor device according to claim 20,
wherein the first antenna is configured to transmit and receive signals, and
wherein the second antenna is configured to apply power to the circuit.

22. The semiconductor device according to claim 20,
wherein the first antenna is configured to transmit signals, and
wherein the second antenna is configured to receive the signals and to apply power to the circuit.

23. A semiconductor device comprising:
a first antenna including a first conductive film;
a second antenna including a second conductive film; and
a circuit over a substrate,
wherein the substrate and the circuit are provided between the first conductive film and the second conductive film,
wherein the first conductive film and the second conductive film are electrically isolated from each other,
wherein the first conductive film is connected to the circuit,
wherein the second conductive film is connected to the circuit in a contact hole formed in the substrate, and
wherein the first antenna, the second antenna and the circuit are covered with a resin.

24. The semiconductor device according to any one of claims 13 though 23,
wherein the circuit includes a rectification circuit, a demodulation circuit, and a modulation circuit,
wherein the first antenna is connected to the rectification circuit and the demodulation circuit, and
wherein the second antenna is connected to the modulation circuit.

25. The semiconductor device according to any one of claims 13 though 23,
wherein the circuit includes a rectification circuit, a demodulation circuit, and a modulation circuit,
wherein the first antenna is connected to the rectification circuit, and
wherein the second antenna is connected to the modulation circuit and the demodulation circuit.

26. A semiconductor device comprising:
an antenna including a first conducting wire and a second conducting wire; and
a circuit having a transistor including at least one interlayer insulating film over a substrate;
wherein the substrate is provided between the first conducting wire and the second conducting wire, and
wherein the first conducting wire and the second conducting wire are connected in a contact hole formed in the substrate and layers including the interlayer insulating film.

27. The semiconductor device according to claim 26,
wherein the substrate is a flexible substrate.

28. A semiconductor device comprising:
an antenna including a first conductive film and a second conductive film; and
a circuit having a transistor including at least one interlayer insulating film over a substrate,
wherein the substrate is provided between the first conductive film and the second conductive film, and
wherein the first conductive film and the second conductive film are connected in a contact hole formed in the substrate and layers including the interlayer insulating film.

29. The semiconductor device according to claim 28,
wherein the substrate is a flexible substrate.

30. A semiconductor device comprising:
a circuit having a thin film transistor including at least one interlayer insulating film over a front surface of a substrate;
an insulating film over the circuit;
a first conducting wire electrically connecting to the circuit through a first contact hole in the insulating film;
a second conducting wire functioning as an antenna over a rear surface of the substrate,
wherein the first conducting wire and the second conducting wire are connected in a second contact hole formed in the substrate and layers including the interlayer insulating film.

31. The semiconductor device according to claim 30,
wherein the substrate is a flexible substrate.

32. The semiconductor device according to claim 30,
wherein the first conducting wire is configured to function as a first antenna for signal transmission and signal reception, and
wherein the second conducting wire is configured to function as a second antenna for apply power to the circuit.

33. The semiconductor device according to claim 30,
wherein the first conducting wire is configured to function as a first antenna for signal transmission, and
wherein the second conducting wire is configured to function as a second antenna for signal reception and for apply power to the circuit.

34. A semiconductor device comprising:
a first conducting wire;
a second conducting wire; and
a circuit including at least one interlayer insulating film over a substrate,
wherein the substrate is provided between the first conducting wire and the second conducting wire, and
wherein the first conducting wire and the second conducting wire are connected in a contact hole formed in the substrate and layers including the interlayer insulating film.

35. The semiconductor device according to claim 34,
wherein the substrate is a flexible substrate.

36. The semiconductor device according to claim 34,
wherein the first conducting wire is configured to function as a first antenna for signal transmission and signal reception, and
wherein the second conducting wire is configured to function as a second antenna for apply power to the circuit.

37. The semiconductor device according to claim 34,
wherein the first conducting wire is configured to function as a first antenna for signal transmission, and
wherein the second conducting wire is configured to function as a second antenna for signal reception and for applying power to the circuit.

38. A semiconductor device comprising:
a first conductive film;
a second conductive film; and
a circuit including at least one interlayer insulating film over a substrate;
wherein the substrate is provided between the first conductive film and the second conductive film, and
wherein the first conductive film and the second conductive film are connected in a contact hole formed in the substrate and layers including the interlayer insulating film.

39. The semiconductor device according to any one of claims 26 though 38,
wherein the circuit includes a rectification circuit, a demodulation circuit, and a modulation circuit.

40. The semiconductor device according to claim 38, wherein the substrate is a flexible substrate.

41. The semiconductor device according to claim 38, wherein the first conductive film is configured to function as a first antenna for signal transmission and signal reception, and
wherein the second conductive film is configured to function as a second antenna for applying power to the circuit.

42. The semiconductor device according to claim 38, wherein the first conductive film is configured to function as a first antenna for signal transmission, and
wherein the second conductive film is configured to function as a second antenna for signal reception and for applying power to the circuit.

* * * * *

UNITED STATES PATENT AND TRADEMARK OFFICE
CERTIFICATE OF CORRECTION

| | | |
|---|---|---|
| PATENT NO. | : 8,049,669 B2 | Page 1 of 1 |
| APPLICATION NO. | : 10/592780 | |
| DATED | : November 1, 2011 | |
| INVENTOR(S) | : Yamazaki et al. | |

It is certified that error appears in the above-identified patent and that said Letters Patent is hereby corrected as shown below:

At column 17, line 38 and 39, "or polyimide" should be --or polyamide--;

At column 29, line 2, "integrated circuit" should be --circuit--;

At column 29, line 51, "integrated circuit" should be --circuit--;

At column 29, line 53, "though" should be --through--;

At column 31, line 26, "though" should be --through--;

At column 31, line 34, "though" should be --through--;

At column 32, line 22, "apply" should be --applying--;

At column 32, line 47, "apply" should be --applying--;

At column 32, line 65, "though" should be --through--.

Signed and Sealed this
Third Day of January, 2012

David J. Kappos
*Director of the United States Patent and Trademark Office*